(12) United States Patent
Hara et al.

(10) Patent No.: US 10,795,225 B2
(45) Date of Patent: Oct. 6, 2020

(54) DISPLAY DEVICE AND METHOD FOR PRODUCING SAME

(71) Applicant: SHARP KABUSHIKI KAISHA, Sakai, Osaka (JP)

(72) Inventors: Yoshihito Hara, Sakai (JP); Masaki Maeda, Sakai (JP); Masakatsu Tominaga, Sakai (JP); Isao Ogasawara, Sakai (JP); Kuniko Maeno, Sakai (JP); Shingo Kamitani, Sakai (JP); Yasuhiro Mimura, Sakai (JP); Satoshi Horiuchi, Sakai (JP); Yoshihiro Asai, Sakai (JP)

(73) Assignee: SHARP KABUSHIKI KAISHA, Sakai, Osaka (JP)

( * ) Notice: Subject to any disclaimer, the term of this patent is extended or adjusted under 35 U.S.C. 154(b) by 35 days.

(21) Appl. No.: 16/308,423

(22) PCT Filed: Jun. 7, 2017

(86) PCT No.: PCT/JP2017/021161
§ 371 (c)(1),
(2) Date: Dec. 7, 2018

(87) PCT Pub. No.: WO2017/213180
PCT Pub. Date: Dec. 14, 2017

(65) Prior Publication Data
US 2019/0258105 A1 Aug. 22, 2019

(30) Foreign Application Priority Data

Jun. 9, 2016 (JP) ................................. 2016-115588

(51) Int. Cl.
*G02F 1/1345* (2006.01)
*H01L 27/12* (2006.01)
(Continued)

(52) U.S. Cl.
CPC ........ *G02F 1/13458* (2013.01); *G02F 1/1333* (2013.01); *G02F 1/1368* (2013.01);
(Continued)

(58) Field of Classification Search
CPC ........ G06F 3/047; G06F 3/044; G06F 3/0412; G06F 3/0416; G02F 1/1345; G02F 1/1343; G02F 1/13458
See application file for complete search history.

(56) References Cited

U.S. PATENT DOCUMENTS

2003/0117561 A1\* 6/2003 Song ................... G02F 1/13458
349/149
2009/0059110 A1\* 3/2009 Sasaki ............... G02F 1/134363
349/39

(Continued)

FOREIGN PATENT DOCUMENTS

JP 2009-058913 A 3/2009
JP 2013-178523 A 9/2013

(Continued)

*Primary Examiner* — Sepehr Azari
(74) *Attorney, Agent, or Firm* — ScienBiziP, P.C.

(57) ABSTRACT

Provided is a display device in which connection defects in terminal parts can be suppressed, and a method for producing the same. An active matrix substrate 1 of a display device includes gate lines, data lines arranged so as to intersect with the gate lines, pixel electrodes, counter electrodes forming capacitors between the same and the pixel electrodes, and signal lines that are connected with the counter electrodes and supply a driving signal for touch detection. Further, the active matrix substrate 1 includes a display driving circuit that supplies a control signal to at least either the gate lines or the data lines, and a touch detection driving circuit that supplies a driving signal for touch detection. Still further, the active matrix substrate 1 includes a plurality of terminal parts Ta to which the display driving circuit and the touch (Continued)

detection driving circuit are connected, and the terminal parts Ta have a common layer structure.

10 Claims, 14 Drawing Sheets

(51) Int. Cl.
    *G06F 3/041*      (2006.01)
    *G02F 1/1333*      (2006.01)
    *G02F 1/1343*      (2006.01)
    *G06F 3/044*      (2006.01)
    *G02F 1/1362*      (2006.01)
    *G02F 1/1368*      (2006.01)
    *G09G 3/36*      (2006.01)

(52) U.S. Cl.
    CPC ...... *G02F 1/13338* (2013.01); *G02F 1/13439* (2013.01); *G02F 1/136259* (2013.01); *G02F 1/136286* (2013.01); *G06F 3/041* (2013.01); *G06F 3/044* (2013.01); *G06F 3/0412* (2013.01); *G06F 3/0416* (2013.01); *G09G 3/3648* (2013.01); *H01L 27/124* (2013.01); *H01L 27/1255* (2013.01); *H01L 27/1259* (2013.01); *G02F 1/136227* (2013.01); *G02F 2001/136295* (2013.01); *G06F 2203/04103* (2013.01)

(56) References Cited

U.S. PATENT DOCUMENTS

| | | | |
|---|---|---|---|
| 2012/0242610 A1* | 9/2012 | Yasumatsu | G06F 3/045 345/173 |
| 2013/0056726 A1* | 3/2013 | Chae | H01L 27/1288 257/43 |
| 2013/0162570 A1* | 6/2013 | Shin | G06F 3/041 345/173 |
| 2015/0162351 A1* | 6/2015 | Hiwatashi | H01L 29/66969 257/43 |
| 2015/0162358 A1* | 6/2015 | Inoue | H01L 27/1262 257/43 |
| 2015/0177880 A1 | 6/2015 | Shin et al. | |
| 2015/0185938 A1 | 7/2015 | Han et al. | |
| 2016/0027800 A1* | 1/2016 | Liu | G02F 1/1345 257/48 |
| 2016/0181291 A1* | 6/2016 | Katoh | H01L 29/78606 257/43 |
| 2016/0188040 A1* | 6/2016 | Shin | G06F 3/047 345/174 |
| 2016/0282990 A1* | 9/2016 | Kimura | G02F 1/13338 |
| 2017/0235325 A1* | 8/2017 | Onoya | G05F 3/08 323/313 |

FOREIGN PATENT DOCUMENTS

| | | |
|---|---|---|
| JP | 2015-122057 A | 7/2015 |
| JP | 2015-125776 A | 7/2015 |

* cited by examiner

F I G. 4
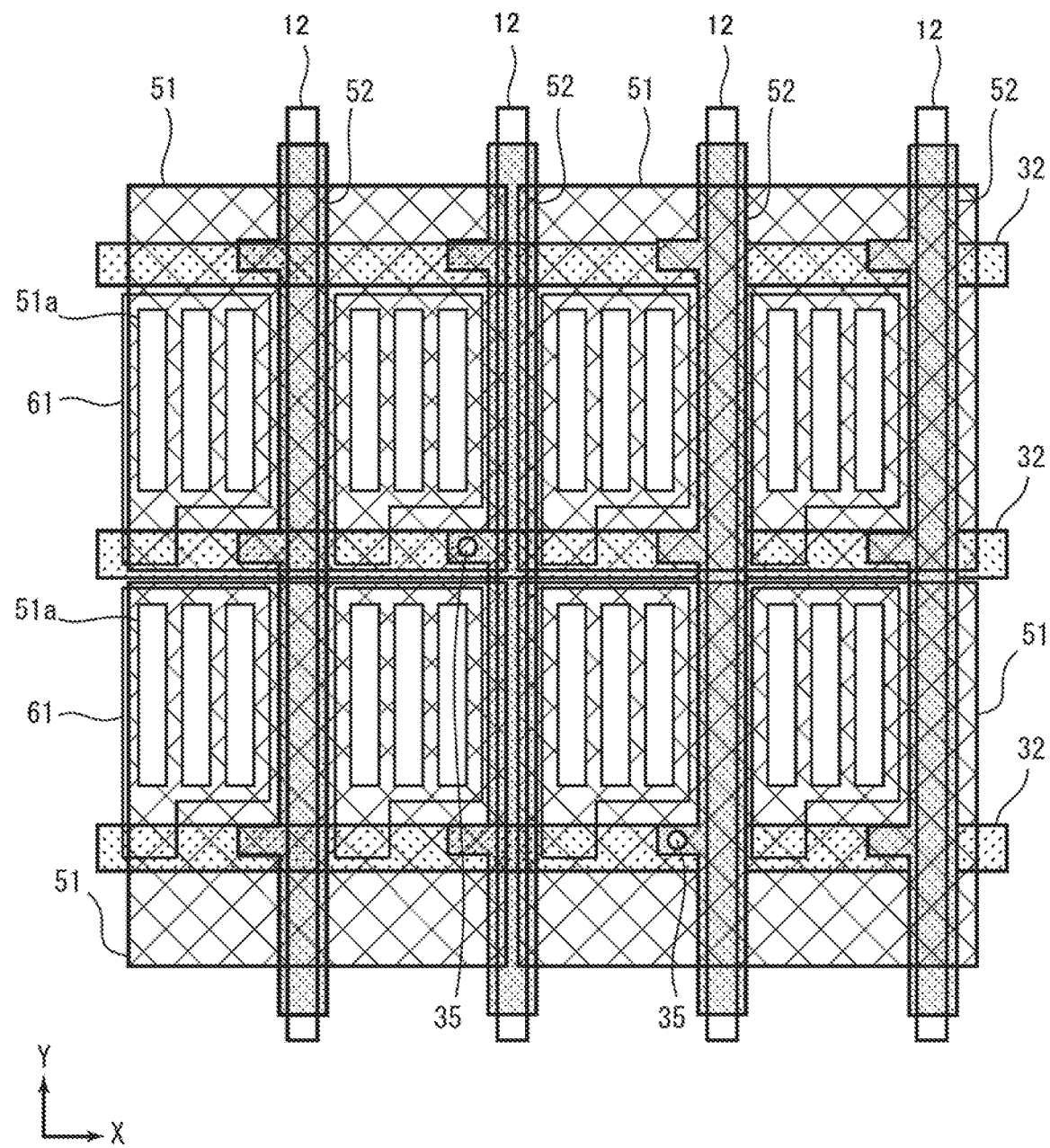

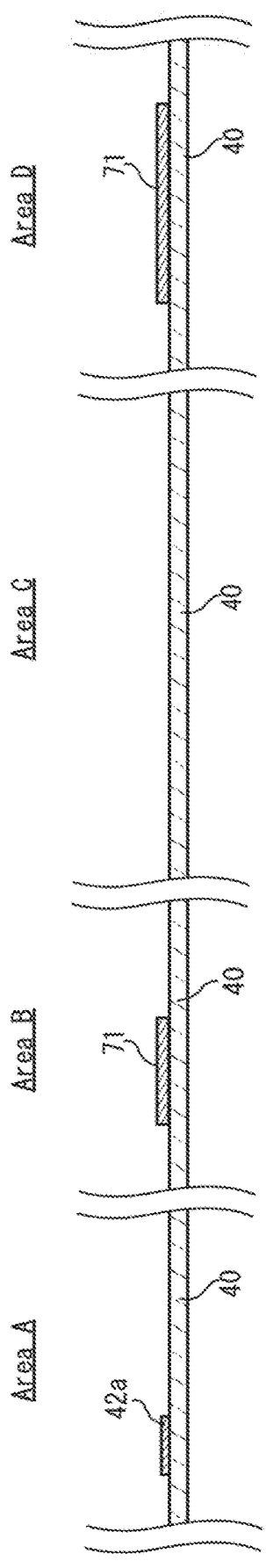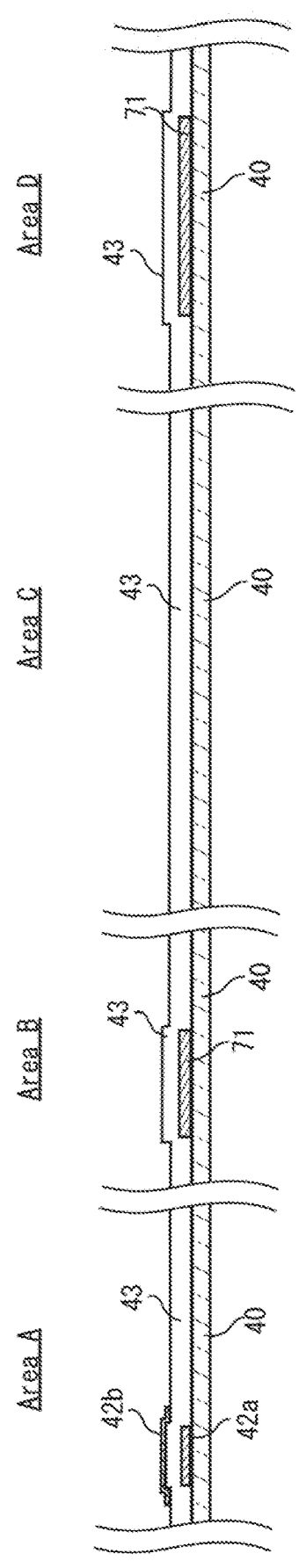

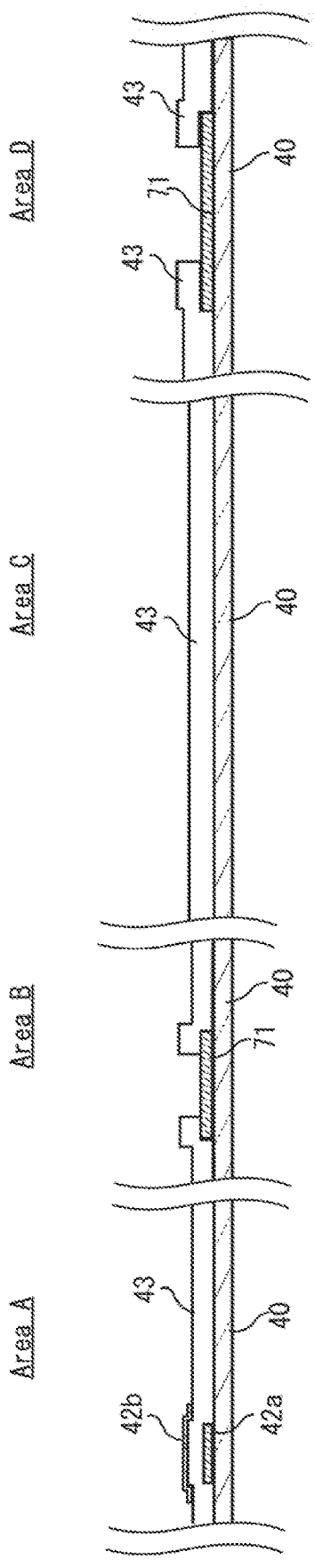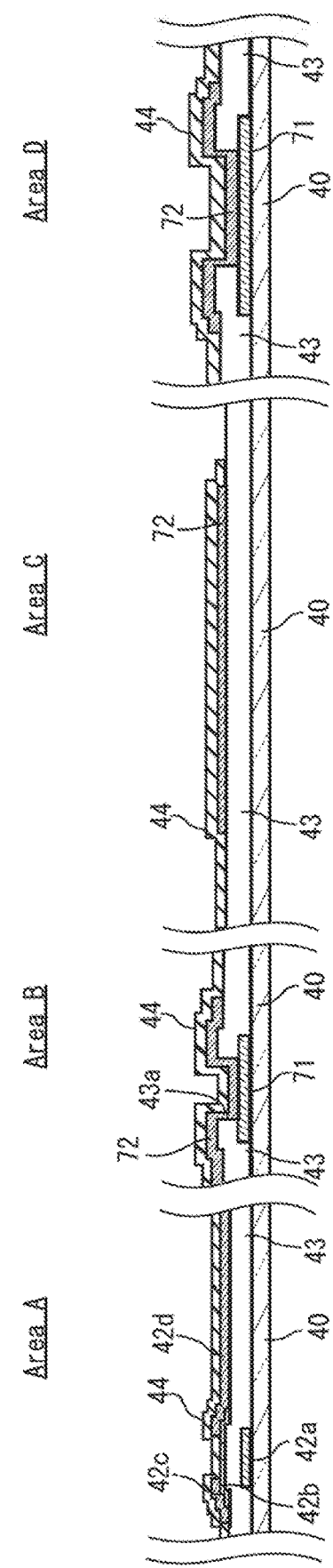

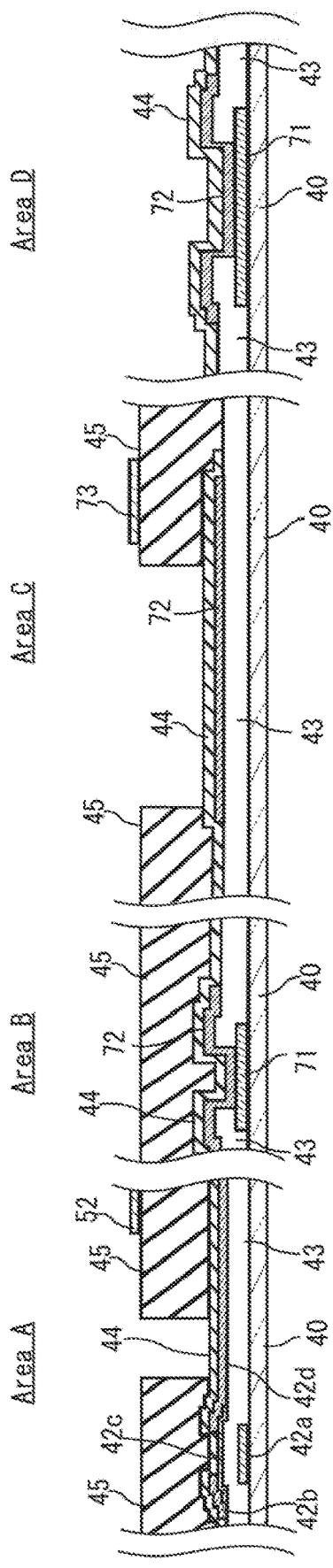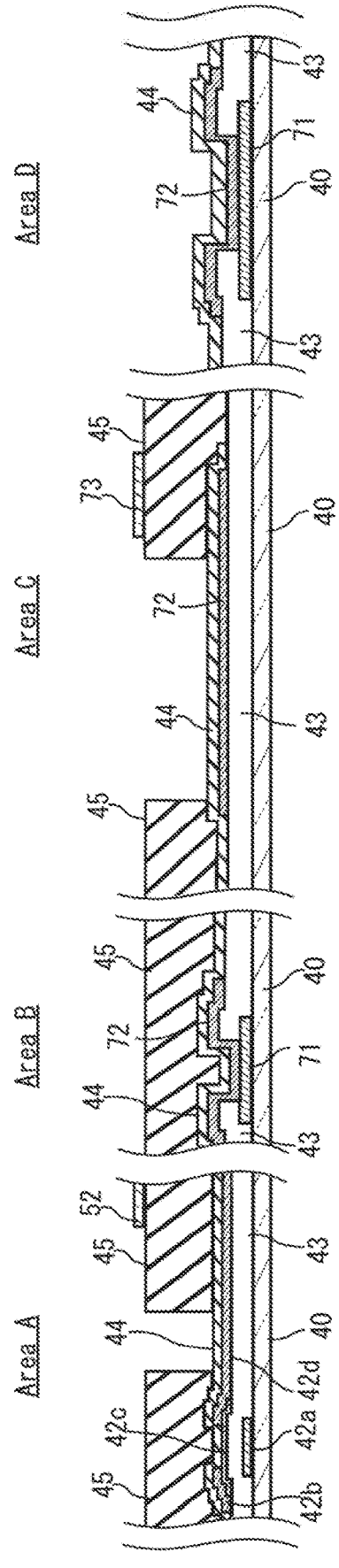

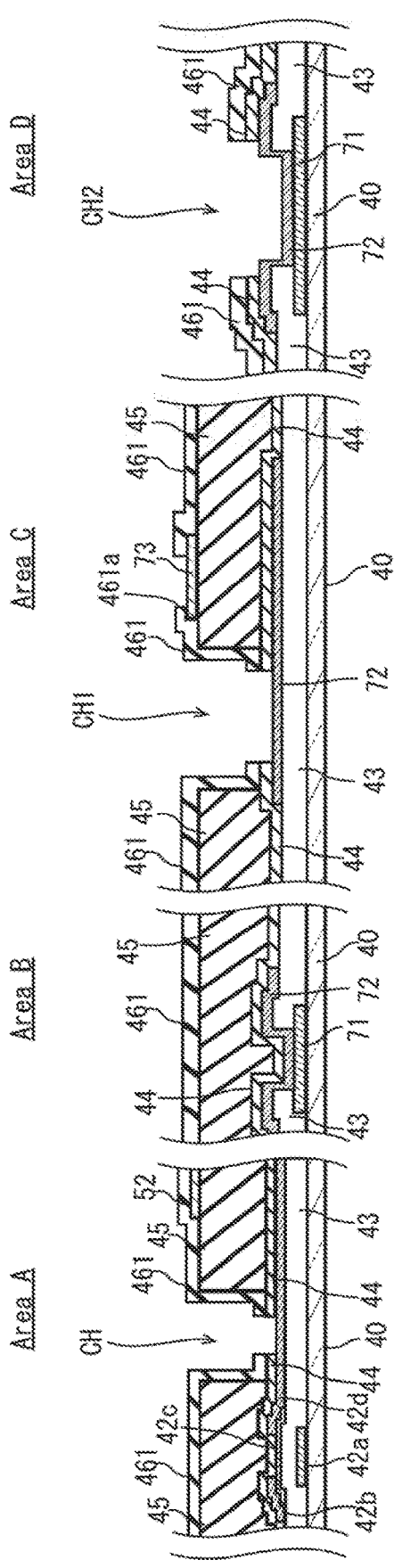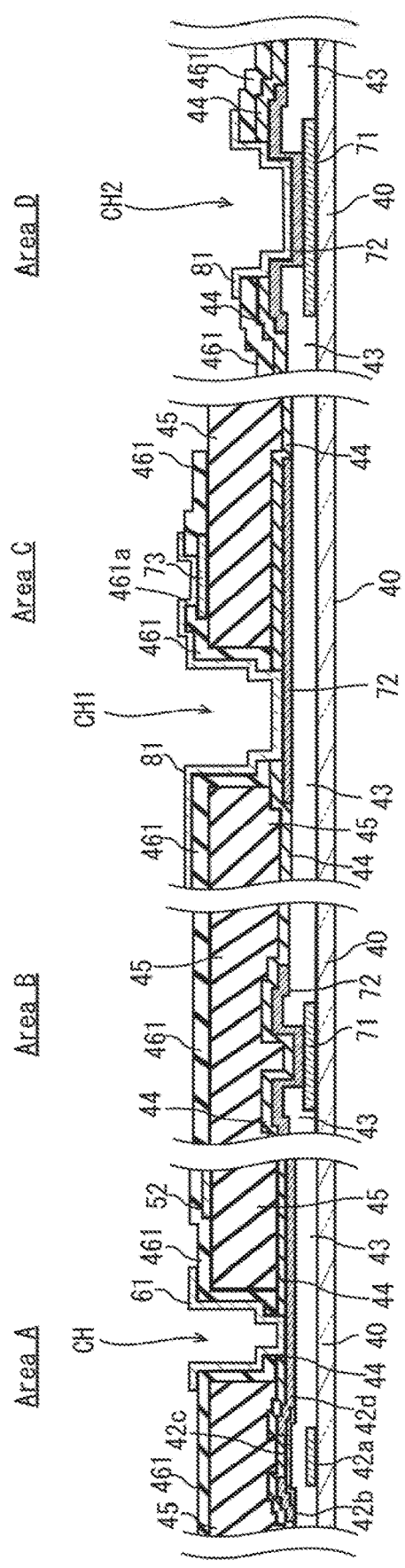

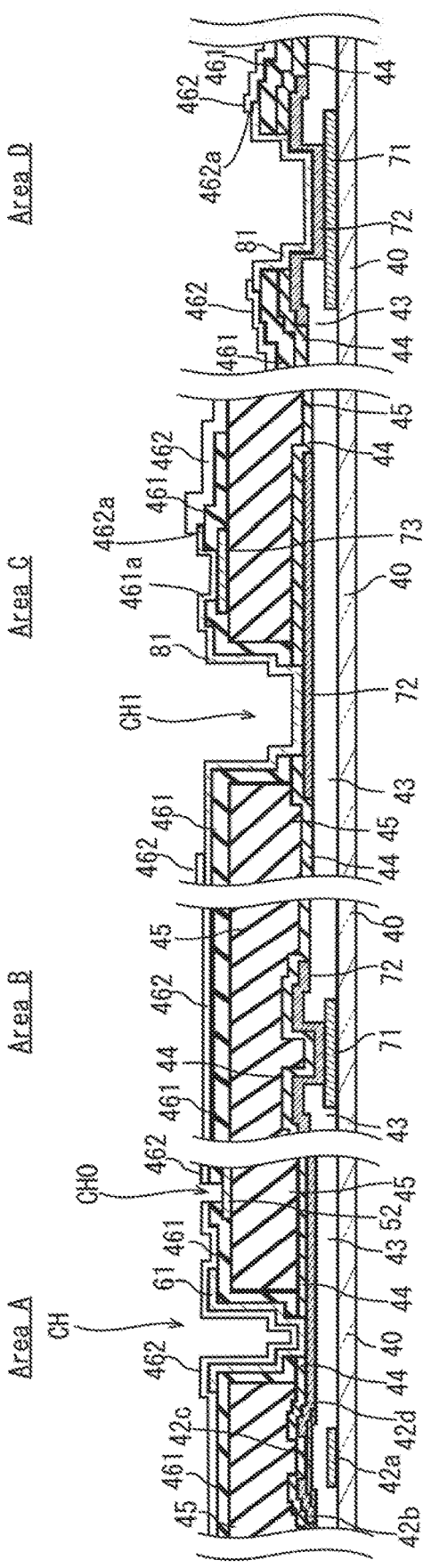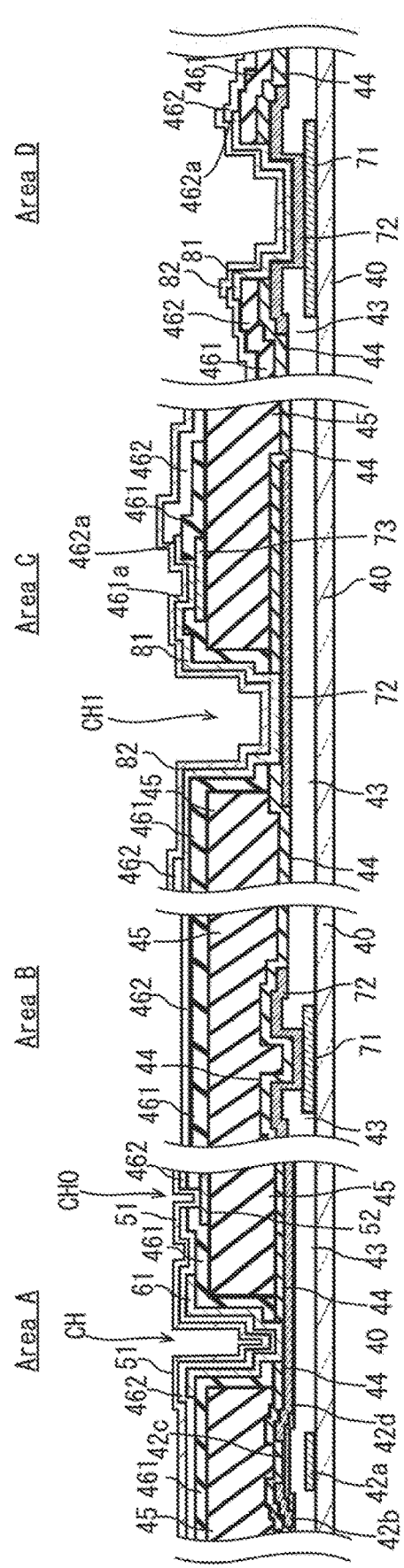

DISPLAY DEVICE AND METHOD FOR PRODUCING SAME

TECHNICAL FIELD

The present invention relates to a display device and a method for producing the same.

BACKGROUND ART

JP-A-2015-122057 discloses a touch screen pane integrated display device that includes a panel that serves as both of a display and a touch screen. On the panel, a plurality of pixels are formed, and each pixel is provided with a pixel electrode, and a transistor connected to the pixel electrode. Further, on the panel, a plurality of electrodes are positioned apart from each other, so as to be opposed to the pixel electrodes. The plurality of electrodes function as common electrodes that form lateral electric fields (horizontal electric fields) between the same and the pixel electrodes in the display driving mode, and function as touch electrodes that form electrostatic capacitors between the same and a finger or the like in the touch driving mode. At least one signal line, approximately parallel with data lines, is connected to each of the plurality of electrodes, so that a touch driving signal or a common voltage signal is supplied thereto via the signal line from a touch integrated circuit.

SUMMARY OF THE INVENTION

In the configuration disclosed in JP-A-2015-122057, the signal lines connected with the electrodes functioning as the touch electrodes or the common electrodes are connected with the touch integrated circuit provided outside the display area. Besides, data lines connected to the pixels are connected with a data driving unit outside the display area, i.e., in an area where the touch integrated circuit is provided. If each terminal part for connection with a control circuit such as a touch integrated circuit or a data driving unit is formed with another film configuration, the heights of the terminal parts are not uniform, and connection defects occur in some cases when the control circuits are press-bonded with the terminal parts.

It is an object of the present invention to provide a display device in which connection defects at terminal parts can be suppressed and a method for producing the same.

A display device in an embodiment of the present invention is a display device including an active matrix substrate, wherein the active matrix substrate includes: a gate line; a data line that is arranged so as to intersect with the gate line; a pixel electrode; a counter electrode that makes a capacitor between the same and the pixel electrode; a display driving circuit that supplies a control signal to at least either the gate line or the data line; a signal line that is connected with the counter electrode, and to which a driving signal for touch detection is supplied; a touch detection driving circuit that supplies a driving signal for touch detection; and a plurality of terminals that are connected with the display driving circuit and the touch detection driving circuit, respectively, wherein the terminals have a common layer structure With the present invention, connection defects in terminal parts can be suppressed.

BRIEF DESCRIPTION OF DRAWINGS

FIG. 4 is an enlarged schematic diagram illustrating a part of the active matrix substrate illustrated in FIG. 1.

FIG. 8A is a cross-sectional view for explaining a method for producing the active matrix substrate illustrated in FIG. 1, illustrating a state in which a gate electrode and a first metal film are formed on a substrate.

FIG. 8B is a cross-sectional view illustrating a step of forming a gate insulating film on the substrate illustrated in FIG. 8A.

FIG. 8C is a cross-sectional view illustrating a step of forming a semiconductor film on the gate insulating film illustrated in FIG. 8B and forming an opening in the gate insulating film.

FIG. 8D is a cross-sectional view illustrating a step of forming a source electrode, a drain electrode, a second metal film, and an inorganic insulating film, subsequent to the state illustrated in FIG. 8C.

FIG. 8E is a cross-sectional view illustrating a step of forming an organic insulating film, subsequent to the state illustrated in FIG. 8D.

FIG. 8F is a cross-sectional view illustrating a step of forming a signal line and a third metal film, subsequent to the state illustrated in FIG. 8E.

FIG. 8G is a cross-sectional view illustrating a step of forming a first insulating film, and forming an opening that passes through the first insulating film and the inorganic insulating film, subsequent to the state illustrated in FIG. 8F.

FIG. 8H is a cross-sectional view illustrating a step of forming a pixel electrode and a first transparent electrode film, subsequent to the state illustrated in FIG. 8G.

FIG. 8I is a cross-sectional view illustrating a step of forming a second insulating film, subsequent to the state illustrated in FIG. 8H.

FIG. 8J is a cross-sectional view illustrating a step of forming a counter electrode and a second transparent electrode film, subsequent to the state illustrated in FIG. 8I.

MODE FOR CARRYING OUT THE INVENTION

Figure 1:
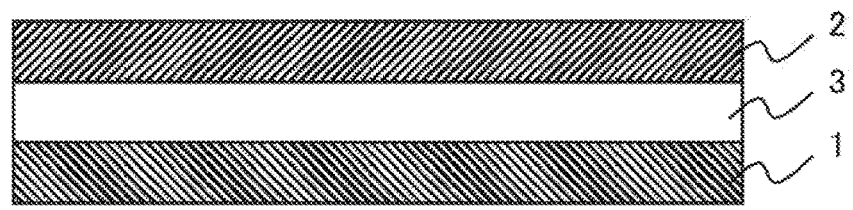
FIG. 1 is a cross-sectional view of a touch-panel-equipped display device in an embodiment.

A display device in one embodiment of the present invention is a display device including an active matrix substrate, wherein the active matrix substrate includes: a gate line; a data line that is arranged so as to intersect with the gate line; a pixel electrode; a counter electrode that makes a capacitor between the same and the pixel electrode; a display driving circuit that supplies a control signal to at least either the gate line or the data line; a signal line that is connected with the counter electrode, and to which a driving signal for touch detection is supplied; a touch detection driving circuit that supplies a driving signal for touch detection; and a plurality of terminals that are connected with the display driving circuit and the touch detection driving circuit, respectively, wherein the terminals have a common layer structure (the first configuration).

According to the first configuration, a display driving circuit for supplying a control signal to at least either the gate line or the data line, and a touch detection driving circuit for supplying a driving signal to the signal line are connected to a plurality of the terminal parts, and the terminal parts have a common layer structure. This allows the heights of the terminal parts to be approximately uniform, and connection defects caused by the press-bonding between the terminal parts and the driving circuits can be reduced, as compared with a case where the heights of the terminal parts are not uniform.

The first configuration may be further characterized in that the layer structure includes: a first metal film made of the same material as that of the gate line; a second metal film made of the same material as that of the data line; a first transparent electrode film made of the same material as that of the pixel electrode; and a second transparent electrode film made of the same material as that of the counter electrode, wherein the first metal film, the second metal film, the first transparent electrode film, and the second transparent electrode film are sequentially laminated (the second configuration).

According to the second configuration, the terminal parts include a first metal film, a second metal film, a first transparent electrode film, and a second transparent electrode film. Accordingly, in the respective steps of forming the gate line, the data line, the pixel electrode, and the counter electrode, the terminal parts can be formed. Further, as the first metal film, the second metal film, the first transparent electrode film, and the second transparent electrode film are laminated, resistances in the terminal parts can be reduced, and spaces can be saved.

The first configuration may be further characterized in that the layer structure includes: a first metal film made of the same material as that of the gate line; a second metal film made of the same material as that of the data line; an insulating film; a third metal film made of the same material as that of the signal line; a first transparent electrode film made of the same material as that of the pixel electrode; and a second transparent electrode film made of the same material as that of the counter electrode, wherein the first metal film, the second metal film, the insulating film, the third metal film, the first transparent electrode film, and the second transparent electrode film are sequentially laminated (the third configuration).

According to the third configuration, the terminal parts are formed by sequentially laminating the first metal film, the second metal film, the insulating film, the third metal film, the first transparent electrode film, and the second transparent electrode film in the stated order. Accordingly, in the respective steps of forming the gate line, the data line, the signal line, the pixel electrode, and the counter electrode, the terminal parts can be formed. As a result, resistances in the terminal parts can be reduced, and spaces can be saved.

The first configuration may be further characterized in that the layer structure includes: a first metal film made of the same material as that of the gate line; a second metal film made of the same material as that of the data line; and a first transparent electrode film made of the same material as that of the pixel electrode, wherein the first metal film, the second metal film, and the first transparent electrode film are sequentially laminated (the fourth configuration).

According to the fourth configuration, the terminal parts are formed by sequentially laminating the first metal film, the second metal film, and the first transparent electrode film. Accordingly, in the respective steps of forming the gate line, the data line, and the pixel electrode, the terminal parts can be formed, and the heights of the terminal parts can be made uniform.

The first configuration may be further characterized in that the layer structure includes: a third metal film made of the same material as that of the signal line; a first transparent electrode film made of the same material as that of the pixel electrode; and a second transparent electrode film made of the same material as that of the counter electrode, wherein the third metal film, the first transparent electrode film, and the second transparent electrode film are sequentially laminated (the fifth configuration).

According to the fifth configuration, the terminal parts are formed by laminating the third metal film, the first transparent electrode film, and the second transparent electrode film. Accordingly, in the respective steps of forming the signal line, the pixel electrode, and the counter electrode, the terminal parts can be formed, and the heights of the terminal parts can be made uniform.

Any one of the second to fifth configurations may be further characterized in that the active matrix substrate further includes a first insulating film and a second insulating film between the signal line and the counter electrode, and the layer structure includes a part where the second insulating film is arranged, the part being in a layer upper with respect to the first transparent electrode film (the sixth configuration).

With the sixth configuration, resistances in the terminal parts can be reduced.

Any one of the first to sixth configurations may be further characterized in that the active matrix substrate further includes an organic insulating film between the pixel electrode and the data line, wherein the organic insulating film is not included in the layer structure (the seventh configuration).

With the seventh configuration, a parasitic capacitance between the pixel electrode and the data line can be reduced.

Any one of the first to seventh configurations may be further characterized in further including: a counter substrate that includes a color filter; and a liquid crystal layer provided between the active matrix substrate and the counter substrate (the eighth configuration).

With the eighth configuration, the present invention can be applied to a display device in which liquid crystal is used.

A method for producing an active matrix substrate of a display device in one embodiment of the present invention is a method for producing an active matrix substrate that includes: a display control element that includes a gate electrode, a semiconductor film, a source electrode, and a drain electrode; and a terminal part for connecting a driving circuit. The method includes the steps of: in the active matrix substrate, forming the gate electrode formed with a first metal film in a display control element area where the display control element is formed, and forming the first metal film in a terminal part area where the terminal part is formed; forming an insulating film so that the insulating film covers the gate electrode and the first metal film in the display control element area and the terminal part area, and forming a first opening in the insulating film on the first metal film; forming a semiconductor film so that the semiconductor film overlaps with the gate electrode, with the insulating film being interposed therebetween, in the display control element area; forming a second metal film so that the source electrode and the drain electrode formed with the second metal film are formed on the semiconductor film in the display control element area, and so that the second metal film is in contact with the first metal film in the first opening in the terminal part area; forming an inorganic insulating film on the source electrode and the drain electrode in the display control element area, as well as on the second metal film in the terminal part area; forming a first insulating film on the inorganic insulating film in the display control element area and the terminal part area; forming second openings that pass through the inorganic insulating film and the first insulating film, in the display control element area and the terminal part area; forming a first transparent electrode film on the first insulating film, so that the first transparent electrode film is in contact with the drain electrode in the second opening in the terminal part area, and is in contact with the second metal film in the second opening in the terminal part area; forming a second insulating film on the first insulating film and the first transparent electrode film in the display control element area and the terminal part area, and forming a third opening in the second insulating film in the terminal part area; and forming a second transparent electrode film on the second insulating film so that a counter electrode formed with the second transparent electrode film is formed on the second insulating film in the display control element area, and so that the second transparent electrode film is in contact with the first transparent electrode film in the third opening in the terminal part area (the ninth configuration).

With the ninth configuration, in the step of forming the display control element, a plurality of terminal parts for connecting a plurality of driving circuits can be formed. Further, since the heights of the terminal parts can be made uniform, connection defects occurring due to press-bonding of the driving circuits to the terminal parts can be reduced, as compared with a case where the heights of the terminal parts are not uniform.

The ninth configuration may be further characterized in further including the step of: after the step of forming the inorganic insulating film in the display control element area and the terminal part area, forming an organic insulating film on the inorganic insulating film, and removing the organic insulating film in the terminal part area (the tenth configuration).

With the tenth configuration, the display control element area can be flattened, and parasitic capacitances between the pixel electrode and other element can be reduced.

Embodiment 1

The following description describes embodiments of the present invention in detail, while referring to the drawings. Identical or equivalent parts in the drawings are denoted by the same reference numerals, and the descriptions of the same are not repeated. To make the description easy to understand, in the drawings referred to hereinafter, the configurations are simply illustrated or schematically illustrated, or the illustration of a part of constituent members is omitted. Further, the dimension ratios of the constituent members illustrated in the drawings do not necessarily indicate the real dimension ratios.

FIG. 1 is a cross-sectional view of a display device in the present embodiment. The display device 100 in the present embodiment includes an active matrix substrate 1, a counter substrate 2, and a liquid crystal layer 3 interposed between the active matrix substrate 1 and the counter substrate 2. Each of the active matrix substrate 1 and the counter substrate 2 includes a glass substrate that is substantially transparent (having high translucency). The counter substrate 2 includes color filters that are not illustrated. Further, though the illustration is omitted, the display device 100 includes a backlight that is provided so as to extend in a surface direction of the active matrix substrate 1 on a side opposite to the liquid crystal layer 3 in FIG. 1.

The display device 100 has a function of displaying an image and a function of detecting a position that a user touches on the displayed image (touch position). This display device 100 is a so-called in-cell type touch panel display device in which elements necessary for detecting a touch position are formed on the active matrix substrate 1.

In the case of the display device 100, the method for driving liquid crystal molecules contained in the liquid crystal layer 3 is the horizontal electric field driving method. To realize the horizontal electric field driving method, pixel electrodes and counter electrodes (common electrodes) for forming electric fields are made on the active matrix substrate 1.

Figure 2:
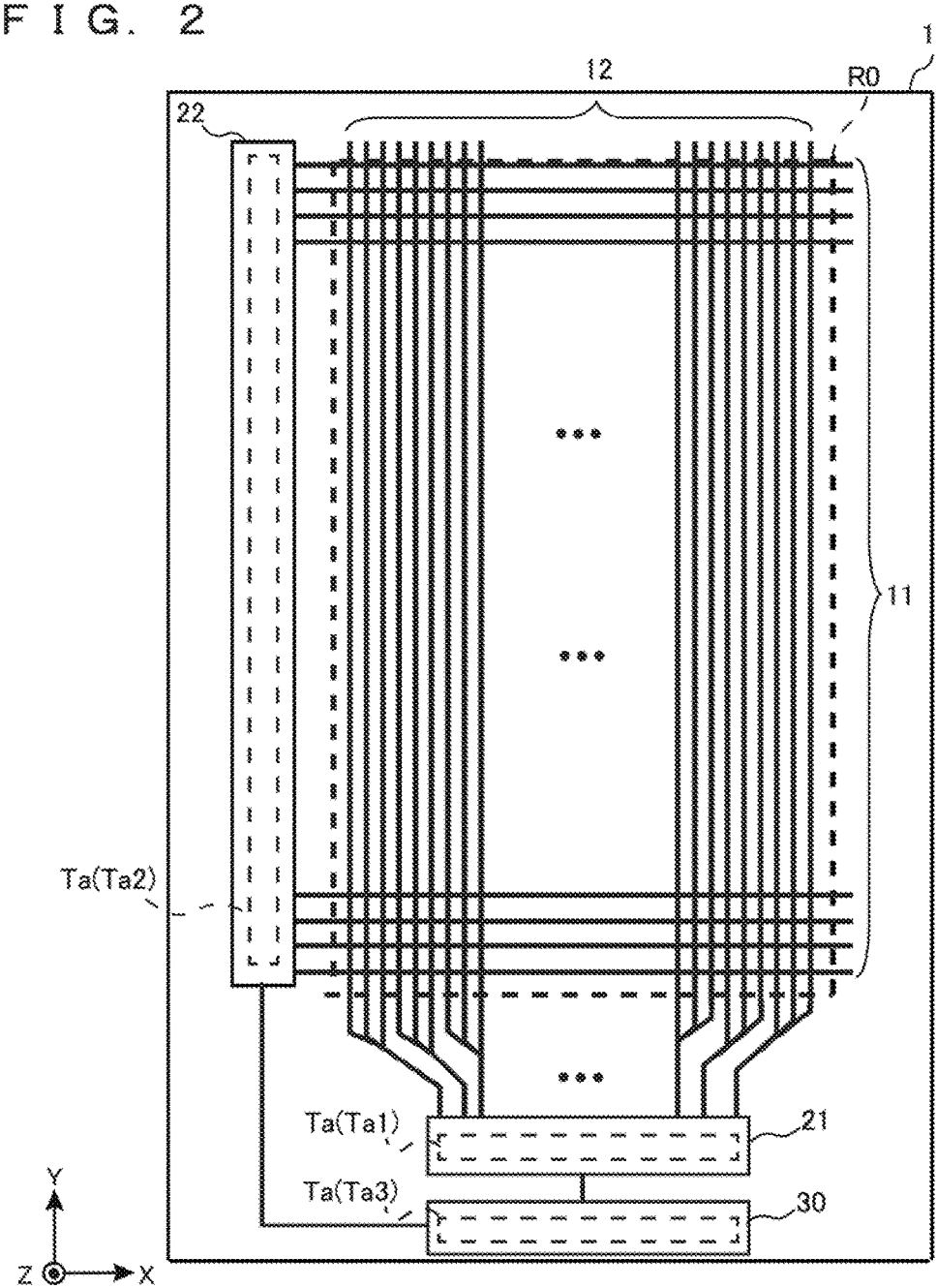
FIG. 2 schematically illustrates a schematic configuration of an active matrix substrate illustrated in FIG. 1.

FIG. 2 is a schematic configuration of the active matrix substrate 1. The active matrix substrate 1 includes a plurality of gate lines 11 and a plurality of source lines 12. The active matrix substrate 1 includes a plurality of pixels defined by the gate lines 11 and the source lines 12, and an area where the pixels are formed serves as a display area R0 of the active matrix substrate 1.

In the active matrix substrate 1, a source driver 21 and a gate driver 22 are connected to terminal parts Ta (Ta1, Ta2) provided in an area (frame area) outside the display area R0. Further, in the active matrix substrate 1, a control circuit 30 for supplying control signals to the source driver 21 and the gate driver 22 is connected to the terminal part Ta (Ta3) provided in the frame area.

The source driver 21 is connected with each source line 12 via the terminal part Ta1, and supplies voltage signals (data signals) according to image data to the source lines 12, respectively, based on control signals from the control circuit 30. The gate driver 22 is connected with each gate line 11 via the terminal part Ta2, and supplies a voltage signal (gate signal) to the respective gate lines 11 sequentially based on control signals from the control circuit 30, so as to scan the gate lines 11.

Figure 3:
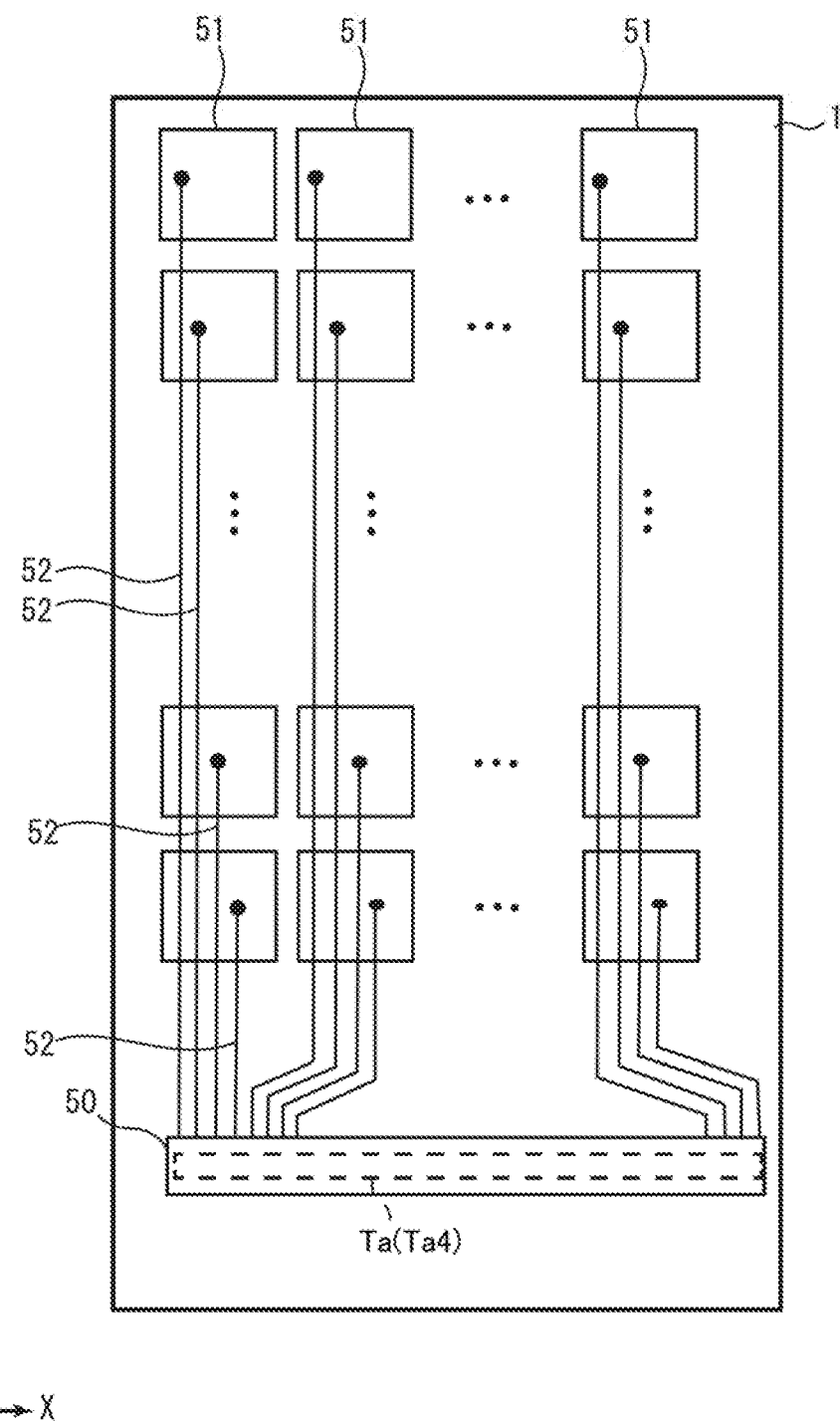
FIG. 3 schematically illustrates an exemplary arrangement of counter electrodes formed on the active matrix substrate illustrated in FIG. 1.

FIG. 3 schematically illustrates an exemplary arrangement of counter electrodes 51 formed on the active matrix substrate 1. The counter electrodes 51 are formed on a liquid crystal layer 3 side surface of the active matrix substrate 1. As illustrated in FIG. 3, the counter electrode 51 is in a rectangular shape, and a plurality of the counter electrodes 51 are arrayed in matrix on the active matrix substrate 1. Each counter electrode 51 is, for example, in an approximately square shape whose side is approximately several millimeters. Though the illustration is omitted in this drawing, slits (having a width of, for example, several micrometers) for causing horizontal electric fields to be generated between the counter electrodes 51 and the pixel electrodes are formed in the counter electrodes 51.

On the active matrix substrate 1, a controller 50 is provided in a terminal part Ta (Ta4) provided in the frame area. The controller 50 performs a controlling operation for displaying an image and a controlling operation for detecting a touch position.

The controller 50 and each counter electrode 51 are connected by signal lines 52 extending in the Y axis direction. More specifically, the same number of the signal lines 52 as the number of the counter electrodes 51 are formed on the active matrix substrate 1.

The counter electrodes 51 in pairs with the pixel electrodes are used during the controlling operation for displaying an image, and are also used during the controlling operation for detecting a touch position.

Regarding the counter electrodes 51, parasitic capacitances are formed between the same and adjacent ones of the counter electrodes 51 or the like. When a human finger or the like touches the display screen, capacitors are formed between the same and the human finger or the like, and electrostatic capacitances increase. During the control for touch position detection, the controller 50 supplies a touch driving signal for detecting a touch position to the counter electrodes 51 through the signal lines 52, and receives a touch detection signal through the signal lines 52. By doing so, the controller 50 detects changes in the electrostatic capacitances at the positions of the counter electrodes 51, and detects a touch position. In other words, the signal lines 52 function as lines for the transmission/reception of the touch driving signal and the touch detection signal.

FIG. 4 is an enlarged schematic diagram illustrating a part of the area of the active matrix substrate 1. As illustrated in FIG. 4, a plurality of pixel electrodes 61 are arranged in matrix. Further, though the illustration is omitted in FIG. 4, thin film transistors (TFTs) as display control elements (switching elements) are also arranged in matrix in correspondence to the pixel electrodes 61, respectively. The counter electrodes 51 are provided with a plurality of slits 51a.

Around the pixel electrodes 61, the gate lines 11 and the source lines 12 are provided. The gate line 11 extends in the X axis direction, and a plurality of the same are arrayed at predetermined intervals in the Y axis direction. The source line 12 extends in the Y axis direction, and a plurality of the same are arrayed at predetermined intervals in the X axis direction. In other words, the gate lines 11 and the source lines 12 are formed in a lattice form, and the pixel electrodes 61 are provided in the areas defined by the gate lines 11 and the source lines 12, respectively. The gate electrode of each TFT is connected with the gate line 11, either the source electrode or the drain electrode of the TFT is connected with the source line 12, and the other one is connected with the pixel electrode 61.

On the counter substrate 2 (see FIG. 1), color filter of three colors of R, G, and B are provided so as to correspond to the pixel electrodes 61, respectively. With this configuration, each of the pixel electrodes 61 functions as a subpixel of any one of the colors of R, G, and B.

As illustrated in FIG. 4, the signal lines 52 extending in the Y axis direction are arranged so as to partially overlap, in the normal line direction of the active matrix substrate 1, with the source lines 12 extending in the Y axis direction. More specifically, the signal lines 52 are provided in a layer upper with respect to the source lines 12, and the signal lines 52 and the source lines 12 partially overlap with each other when viewed in a plan view.

In FIG. 4, white circles 35 indicate portions at which the counter electrode 51 and the signal lines 52 are connected with each other.

Figure 5:
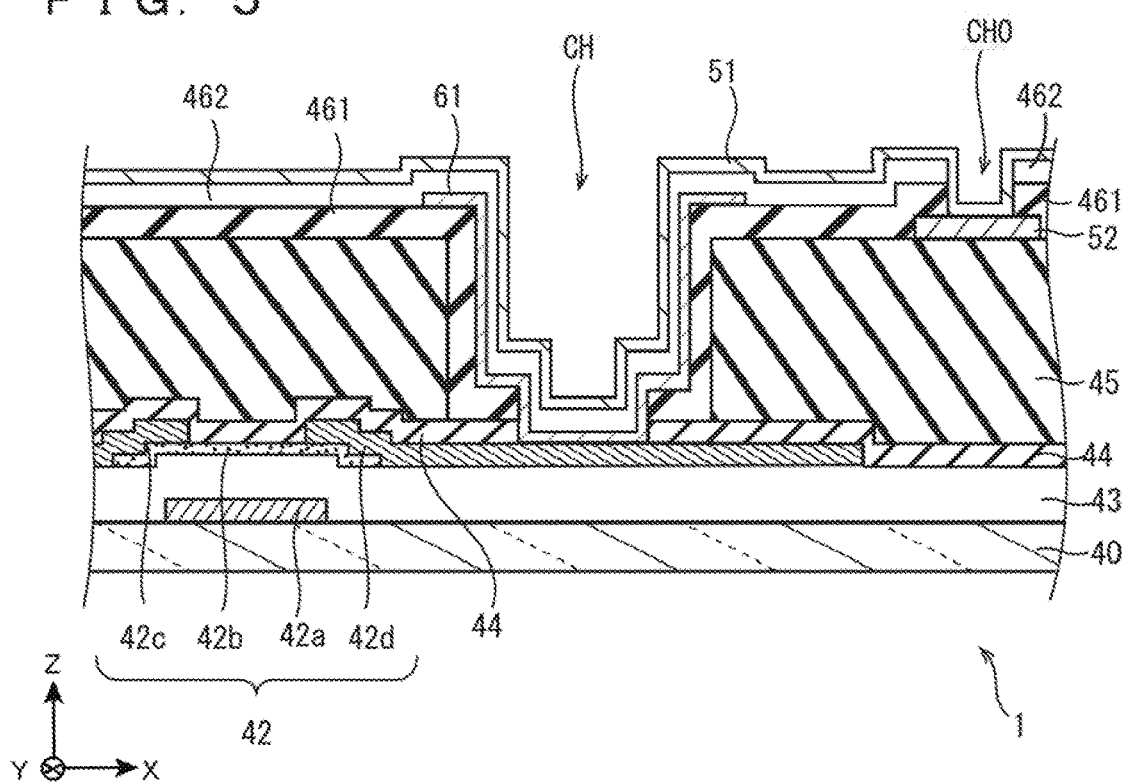
FIG. 5 is a cross-sectional view of the active matrix substrate illustrated in FIG. 1, in a TFT-arranged area and a signal line connection area.

FIG. 5 is a cross-sectional view of the active matrix substrate 1, in an area thereof where the TFT is arranged, and the signal line 52 is connected with the counter electrode 51 (this area is hereinafter referred to as a "signal line connection area"). As illustrated in FIG. 5, a TFT 42 as a display control element is provided on a glass substrate 40. The TFT 42 includes a gate electrode 42a, a semiconductor film 42b, a source electrode 42c, and a drain electrode 42d.

The gate electrode 42a of the TFT 42 is formed on the glass substrate 40. The gate electrode 42a is formed with, for example, a laminate film of titanium (Ti) and copper (Cu). The gate insulating film 43 is formed so as to cover the gate electrode 42a. The gate insulating film 43 is made of, for example, silicon nitride (SiNx), silicon dioxide ($SiO_2$), or the like.

On the gate insulating film 43, a semiconductor film 42b is formed. The semiconductor film 42b is, for example, an oxide semiconductor film, and may contain at least one metal element among In, Ga, and Zn. In the present embodiment, the semiconductor film 42b contains, for example, In—Ga—Zn—O-based semiconductor. Here, the In—Ga—Zn—O-based semiconductor is a ternary oxide of indium (In), gallium (Ga), and zinc (Zn), in which the ratio (composition ratio) of In, Ga, and Zn is not limited particularly, and examples of the ratio include In:Ga:Zn=2:2:1, In:Ga:Zn=1:1:1, and In:Ga:Zn=1:1:2.

The source electrode 42c and the drain electrode 42d are provided on the semiconductor film 42b so as to be positioned apart from each other. The source electrode 42c and the drain electrode 42d are formed with, for example, laminate films made of titanium (Ti) and copper (Cu).

An inorganic insulating film 44 is formed so as to cover the source electrode 42c and the drain electrode 42d. The inorganic insulating film 44 is made of an inorganic material, for example, silicon nitride ($SiN_x$) or silicon dioxide ($SiO_2$).

On the inorganic insulating film 44, an organic insulating film (flattening film) 45 is formed. The organic insulating film 45 is made of, for example, an acryl-based organic resin material such as polymethyl methacrylate resin (PMMA). By forming the organic insulating film (flattening film) 45, disturbance of the alignment of liquid crystal molecules caused by protrusions and recesses in TFT portions can be suppressed. Further, parasitic capacitances between the gate lines 11 or the source lines 12 and the pixel electrodes 61 can be reduced. The organic insulating film 45, however, can be omitted.

On the organic insulating film 45, the signal lines 52 are formed. The signal lines 52 are made of, for example, any one of copper (Cu), titanium (Ti), molybdenum (Mo), aluminum (Al), magnesium (Mg), cobalt (Co), chromium (Cr), tungsten (W), or a mixture of any of these.

Further, on the organic insulating film 45, a first insulating film 461 is formed. The first insulating film 461 is formed so as to cover a part of the signal lines 52. The first insulating film 461 is made of, for example, silicon nitride (SiNx), or silicon dioxide ($SiO_2$).

On the drain electrode 42d, an opening CH is formed so as to pass through the first insulating film 461 and the inorganic insulating film 44. On the first insulating film 461, the pixel electrode 61 is formed at a position that does not overlap with the signal line 52, so as to be in contact with the drain electrode 42d via the opening CH. The pixel electrode 61 is a transparent electrode, and is made of a material such as indium tin oxide (ITO), zinc oxide (ZnO), indium zinc oxide (IZO), indium gallium zinc oxide (IGZO), indium tin zinc oxide (ITZO), or the like.

Still further, on the first insulating film 461 and the pixel electrodes 61, a second insulating film 462 (second insulating layer) is formed. The second insulating film 462 is made of, for example, silicon nitride (SiNx), silicon dioxide ($SiO_2$), or the like. On the signal line 52, an opening CH0 is formed so as to pass through the second insulating film 462 and the first insulating film 461. In the signal line connection area, the opening CH0 is provided in the first insulating film 461 and the second insulating film 462, but in an area where the signal line 52 and the counter electrode 51 are not connected, the opening CH0 is not provided.

On the second insulating film 462, the counter electrode 51 is formed so as to be in contact with the signal line 52 at the opening CH0. The counter electrode 51 is a transparent electrode made of a material such as ITO, ZnO, IZO, IGZO, ITZO, or the like.

Figure 6:
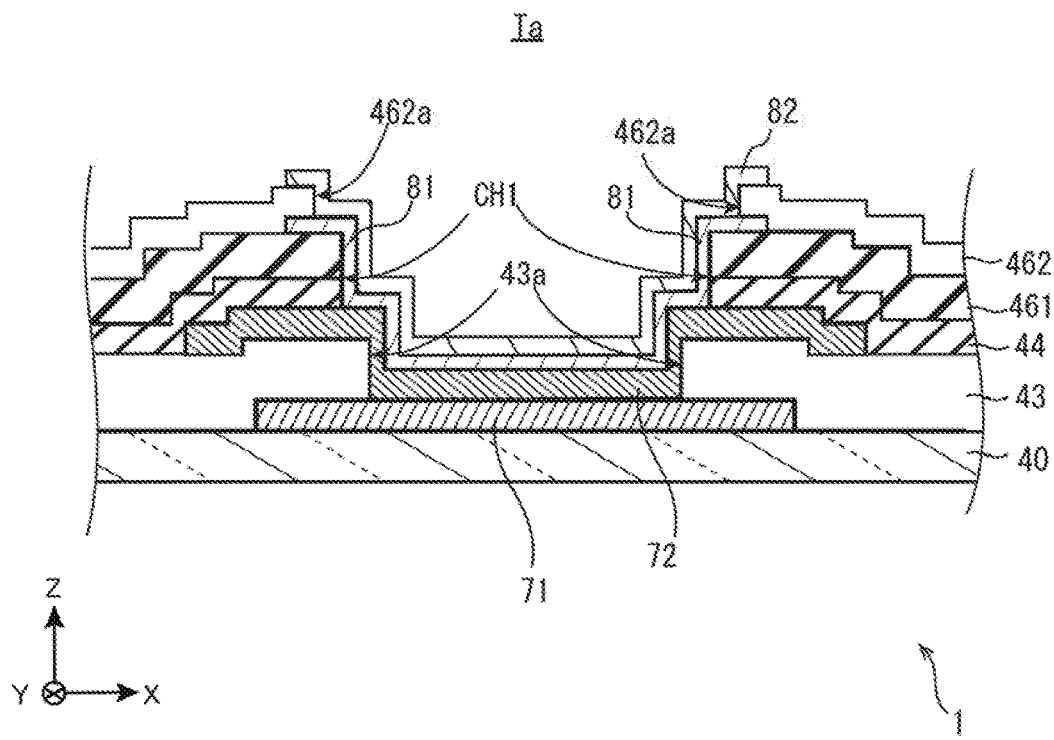
FIG. 6 is a cross-sectional view of a terminal part in an embodiment.

FIG. 6 is a cross-sectional view of a terminal part Ta in the present embodiment. In the present embodiment, the terminal parts Ta (Ta1, Ta2, Ta3, Ta4) to which the source driver 21, the gate driver 22, the control circuit 30, and the controller 50 are connected, respectively, have a common structure.

As illustrated in FIG. 6, in the terminal part Ta, a first metal film 71 is formed on the glass substrate 40. The first metal film 71 is a metal film that is used when the gate line 11 (see FIG. 2), or the gate electrode 42a of the TFT 42 (see FIG. 5), is formed.

On the first metal film 71, the gate insulating film 43 is formed, and an opening 43a is provided in the gate insulating film 43.

On the gate insulating film 43, a second metal film 72 is formed so as to be in contact with the first metal film 71 via the opening 43a. The second metal film 72 is a metal film that is used when the source line 12 (see FIG. 2), or the source electrode 42c and the drain electrode 42d of the TFT 42, are formed.

On the second metal film 72 and the gate insulating film 43, the inorganic insulating film 44 is formed, and on the inorganic insulating film 44, the first insulating film 461 is formed. In the inorganic insulating film 44 and the first insulating film 461, an opening CH1 is provided.

A first transparent electrode film 81 is formed on the first insulating film 461 so as to be in contact with the second metal film 72 via the opening CH1. The first transparent electrode film 81 is a transparent electrode film that is used when the pixel electrode 61 is formed, but the first transparent electrode film 81 is not electrically connected with the pixel electrode 61.

On a part of the first transparent electrode film 81 and the first insulating film 461, the second insulating film 462 is formed. In the second insulating film 462, an opening 462a is provided.

A second transparent electrode film 82 is formed on the second insulating film 462 so as to be in contact with the first transparent electrode film 81 via the opening 462a. The second transparent electrode film 82 is a transparent electrode film that is used when the counter electrode 51 is formed, but the second transparent electrode film 82 is not electrically connected with the counter electrode 51.

As described above, the source driver 21 is connected with the source line 12 via the terminal part Ta1, and the gate driver 22 is connected with the gate line 11 via the terminal part Ta2. Further, the control circuit 30 is connected with the source driver 21 and the gate driver 22 via the terminal part Ta3, and the controller 50 is connected with the signal line 52 via the terminal part Ta4. The terminal part Ta1 and the source line 12 are connected with each other by extending the same metal film as the first metal film or the second metal film 72 in each terminal part Ta; so are the terminal part Ta2 and the gate line 11, the terminal part Ta4 and the signal line 52, as well as the terminal part Ta4 and the source driver 21/the gate driver 22.

Alternatively, the gate line 11 may be made of the same material as that of the first metal film 71 of the terminal part Ta, or the source line 12 may be made of the same material as that of the second metal film 72 of the terminal part Ta. In a case, however, a metal film made of the same material as a line is extended from the terminal part Ta to the position of the line, the line arrangement is limited further as the number of lines increases, and it is unlikely that the heights of the films would be uniform. In the configuration in which a metal film made of a material different from that of the line is used, therefore, the degree of freedom in the arrangement is improved. For example, the second metal film 72 made of the same material as the source line 12 may be extended to the gate line 11 so that the gate line 11 and the second metal film 72 are connected with each other. Alternatively, the first metal film 71 made of the same material as that of the gate line 11 may be extended to the source line 12, so that the source line 12 and the first metal film 71 are connected with each other. Further alternatively, the first metal film 71 or the second metal film 72 in the terminal part Ta may be extended to the signal line 52 so as to be connected with the signal line 52. In this way, in a case where a metal film to be connected with a line is made of a material different from that of the line, a connection part that connects the metal film and the line to be connected with the metal film is needed.

Figure 7A:
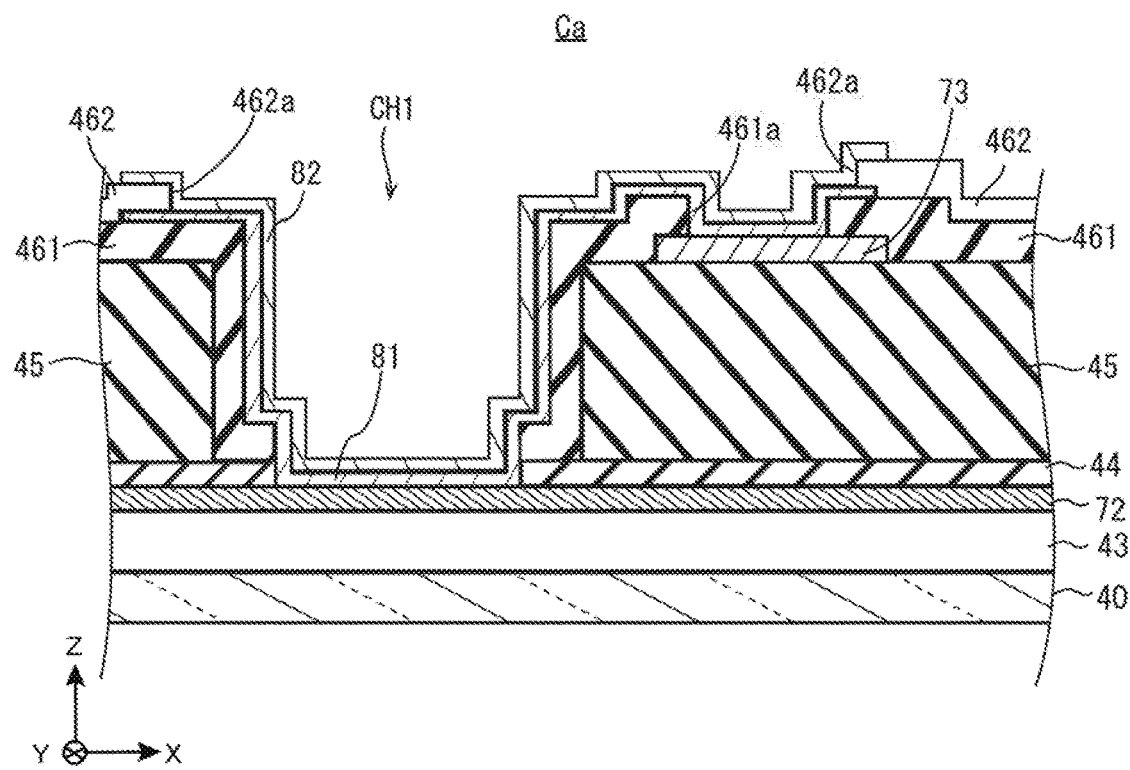
FIG. 7A is a cross-sectional view illustrating a connection part that connects the terminal part illustrated in FIG. 6 and signal line illustrated in FIG. 3.

FIG. 7A is a cross-sectional view illustrating a connection part Ca that connects the second metal film 72 in the terminal part Ta with the signal line 52. As illustrated in FIG. 7A, in the connection part Ca, the second metal film 72 is formed on the gate insulating film 43, and the inorganic insulating film 44 is formed on the on the second metal film 72.

On a part of the inorganic insulating film 44, the organic insulating film 45 is formed. On the organic insulating film 45, a third metal film 73 made of the same material as that of the signal line 52 is formed. Incidentally, in a case where the connection part Ca is a connection part obtained by extending the second metal film 72 in the terminal part Ta to the signal line 52 so as to connect the second metal film 72 and the signal line 52, the third metal film 73 is connected with the signal line 52.

Further, the first insulating film 461 is formed so as to overlap with a part of the inorganic insulating film 44, the organic insulating film 45, and the third metal film 73.

In the first insulating film 461 and the inorganic insulating film 44, the opening CH1 is formed. Further, on the third metal film 73, an opening 461*a* is formed in the first insulating film 461. The first transparent electrode film 81 is formed on the first insulating film 461, so as to be in contact with the second metal film 72 via the opening CH1, and in contact with the third metal film 73 via the opening 461*a*.

Further, on a part of the first insulating film 461 and the first transparent electrode film 81, the second insulating film 462 is formed. Besides, the second transparent electrode film 82 is formed on the second insulating film 462 so as to be in contact with the first transparent electrode film 81 at the opening 462*a* provided in the second insulating film 462.

In this way, in the connection part Ca, the second metal film 72 is connected with the third metal film 73 with the first transparent electrode film 81 and the second transparent electrode film 82 being interposed therebetween. In other words, in a case where the second metal film 72 of the terminal part Ta4 is extended to the signal line 52, the signal line 52 (third metal film) is connected with the second metal film 72 with the first transparent electrode film 81 and the second transparent electrode film 82 being interposed therebetween, in the connection part Ca. With this configuration, the signal line 52 is connected with the controller 50, via the connection part Ca and the terminal part Ta4.

Incidentally, in a case where the first metal film 71 of the terminal part Ta4 is extended to the signal line 52, a connection part for connecting the first metal film 71 and the second metal film 72 of the connection part Ca is needed, in addition to the connection part Ca.

Figure 7B:
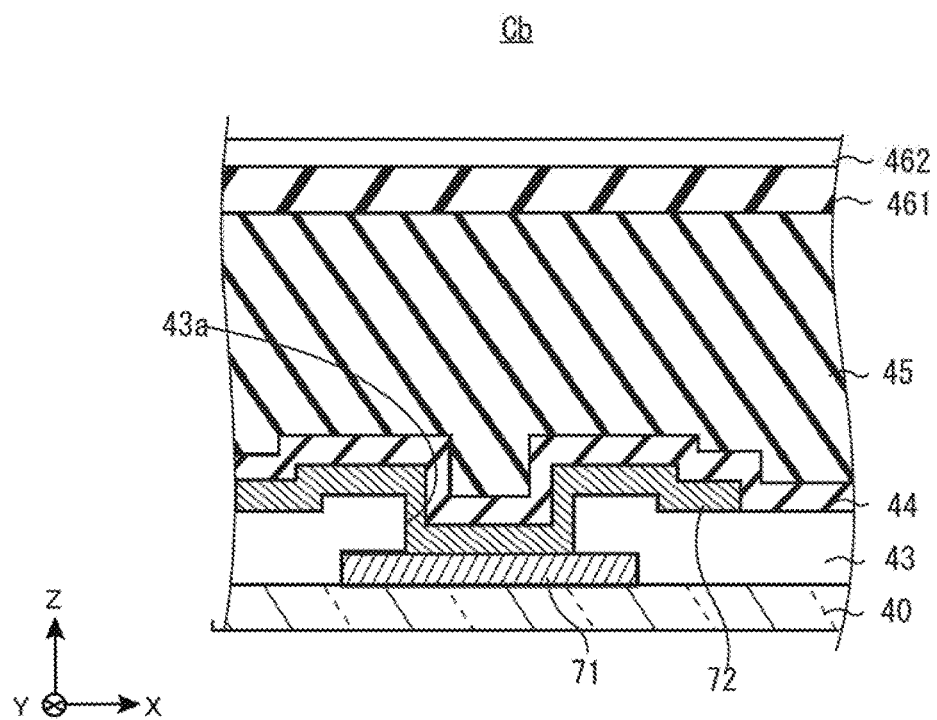
FIG. 7B is a cross-sectional view illustrating a connection part that connects a first metal film and a second metal film of the connection part illustrated in FIG. 7A.

FIG. 7B is a cross-sectional view illustrating a connection part Cb for connecting the first metal film 71 and the second metal film 72. As illustrated in FIG. 7B, in the connection part Cb, the first metal film 71 is formed on the glass substrate 40, and the gate insulating film 43 is provided on the first metal film 71. The second metal film 72 is formed on the gate insulating film 43 so as to be in contact with the first metal film 71 via the opening 43*a* provided in the gate insulating film 43. Incidentally, the first metal film 71 in the connection part Cb is connected with the first metal film 71 in the terminal part Ta. Further, whereas the second metal film 72 in the connection part Ca and the second metal film 72 in the connection part Cb are connected, these second metal films 72 and the second metal film 72 in the terminal part Ta are not electrically connected with each other.

The inorganic insulating film 44 is formed on the second metal film 72, and the organic insulating film 45 is formed on the inorganic insulating film 44. Further, the first insulating film 461 is formed on the organic insulating film 45, and the second insulating film 462 is formed on the first insulating film 461.

In a case where the first metal film 71 of the terminal part Ta4 is extended to the signal line 52, therefore, the first metal film 71 is connected with the second metal film 72 in the connection part Cb, and the second metal film 72 and the third metal film 73 are connected with each other in the connection part Ca. With this configuration, the signal line 52 is connected with controller 50, via the connection part Cb, the connection part Ca, and the terminal part Ta4.

Further, in a case where the first metal film 71 of the terminal part Ta1 is extended to the source line 12, the first metal film 71 is connected with the second metal film 72 in the connection part Cb. Incidentally, in this case, whereas the second metal film 72 in the connection part Cb is connected with the source line 12, the second metal film 72 in the terminal part Ta1 is not connected with the source line 12. With this configuration, the source line 12 is connected with the source driver 21 via the connection part Cb and the terminal part Ta1.

Further, in a case where the second metal film 72 of the terminal part Ta2 is extended to the gate line 11, the second metal film 72 is connected with the first metal film 71 in the connection part Cb. Incidentally, in this case, whereas the first metal film 71 in the connection part Cb is connected with the gate line 11, the first metal film 71 in the terminal part Ta is not connected with the gate line 11. With this configuration, the gate line 11 is connected with the gate driver 22 via the connection part Cb and the terminal part Ta2.

(Producing Process)

FIGS. 8A to 8J are drawings for explaining a process for producing the active matrix substrate 1 in the present embodiment. More specifically, FIGS. 8A to 8J are cross-sectional views of the active matrix substrate 1 in respective steps of the producing process in an area A that includes a TFT-42-formed area and a signal line connection area, and areas B to D where the above-described connection parts Ca and Cb, as well as the terminal part Ta are formed, respectively. The following description describes the respective steps of the producing process.

First, on the glass substrate 40, a first metal film containing, for example, copper, is formed, and photolithography, wet etching, and resist peeling are performed so as to pattern the first metal film. With this configuration, in the area A, the gate electrode 42*a* formed with the first metal film is formed, and in the areas B and D, the first metal film 71 is formed (see FIG. 8A).

Next, the gate insulating film 43 is formed so as to cover the gate electrode 42*a* and the first metal film 71. Then, in the area A, a semiconductor film containing, for example, In, Ga, Zn, and oxygen is formed so as to overlap with the gate electrode 42*a* with the gate insulating film 43 being interposed therebetween. Then, photolithography and wet etching are performed so as to pattern the semiconductor film. Through this step, the semiconductor film 42*b* is formed on the gate insulating film 43 in the area A (see FIG. 8B).

Next, in the areas B and D, the gate insulating film 43 is patterned by using photolithography and dry etching. This causes the openings 43*a* to be formed in the gate insulating film 43 in the area B and the area D (see FIG. 8C).

Subsequently, in the areas A to D, a second metal film containing, for example, copper is formed on the gate insulating film 43, then, photolithography, wet etching, and resist peeling are performed so as to pattern the second metal film, and thereafter, an inorganic insulating film is formed. Through this step, in the area A, the source electrode 42*c* and the drain electrode 42*d* are formed on the semiconductor film 42*b* so as to be positioned apart from each other, and the inorganic insulating film 44 is formed so as to cover the source electrode 42*c* and the drain electrode 42*d*. Further, in the areas B and D, the second metal film 72 is formed so as to be in contact with the first metal film 71 in the opening 43*a*, and the inorganic insulating film 44 is formed on the second metal film 72. Still further, in the area C, the second metal film 72 is formed on the gate insulating film 43, and the inorganic insulating film 44 is formed so as to cover the second metal film 72 (see FIG. 8D).

Next, on the inorganic insulating film 44, an organic insulating film is patterned by using photolithography, and is baked. Through this step, in the areas A and C, the organic insulating film 45 is formed on the inorganic insulating film 44 so as to be positioned apart from each other, and in the area B, the organic insulating film 45 is formed so as to overlap with the inorganic insulating film 44 (see FIG. 8E).

Subsequently, on the organic insulating film 45, a third metal film containing, for example, copper is formed, and is patterned by performing photolithography, wet etching, and resist peeling. Through this step, in the area A, the signal line 52 is formed on the organic insulating film 45. Further, in the area C, the third metal film 73 is formed on the organic insulating film 45 (see FIG. 8F).

Next, on the organic insulating film 45 in the areas A to C, and on the inorganic insulating film 44 in the area D, a first insulating film is formed, and photolithography, dry etching, and resist peeling are performed so as to pattern the first insulating film.

Through these steps, in the area A, the first insulating film 461 is formed on the organic insulating film 45, the opening CH passing through the first insulating film 461 and the inorganic insulating film 44 is formed, whereby the surface of the drain electrode 42d is partially exposed. In the area B, the first insulating film 461 is formed so as to overlap with the organic insulating film 45. In the area C, the first insulating film 461 is formed on the organic insulating film 45, the opening CH1 passing through the first insulating film 461 and the inorganic insulating film 44, as well as the opening 461a in the first insulating film 461, are formed, whereby the surfaces of the second metal film 72 and the third metal film 73 are partially exposed. Further, in the area D, the first insulating film 461 is formed on the inorganic insulating film 44, and the opening CH2 passing through the first insulating film 461 and the inorganic insulating film 44 is formed, whereby a part of the surface of the second metal film 72 is exposed (see FIG. 8G).

Next, on the first insulating film 461, a transparent electrode film made of, for example, ITO or the like is formed, and photolithography, wet etching, and resist peeling are performed so as to pattern the transparent electrode film. Through this step, in the area A, the pixel electrode 61 is formed so as to be in contact with the drain electrode 42d via the opening CH. Further, in the area C, the first transparent electrode film 81 is formed so as to be in contact with the second metal film 72 via the opening CH1, and in contact with the third metal film 73 via the opening 461a. Further, in the area D, the first transparent electrode film 81 is formed on the inorganic insulating film 44 so as to be in contact with the second metal film 72 via the opening CH2 (see FIG. 8H).

Next, in the areas A to D, a second insulating film is formed on the first insulating film 461, and photolithography, dry etching, and resist peeling are performed so as to pattern the second insulating film. Through this step, in the area A, the second insulating film 462 is formed on the first insulating film 461 and the first transparent electrode film 81, and the opening CH0 passing through the first insulating film 461 and the second insulating film 462 is formed on the signal line 52. In the area B, the second insulating film 462 is formed so as to overlap with the first insulating film 461. Further, in the areas C and D, the second insulating film 462 is formed on a part of the first transparent electrode film 81 and the first insulating film 461, and the opening 462a is formed in the second insulating film 462 (see FIG. 8I).

Next, in the areas A to D, a transparent electrode film made of, for example, ITO or the like is formed on the second insulating film 462, and photolithography, wet etching, and resist peeling are performed so as to pattern the transparent electrode film. Through this step, in the area A, the counter electrode 51 is formed on the second insulating film 462 so as to be in contact with the signal line 52 via the opening CH0. Further, in the areas C and D, the second transparent electrode film 82 is formed on the second insulating film 462 so as to be in contact with the first transparent electrode film 81 at the opening 462a (see FIG. 8J).

In the above-described embodiment, the terminal parts Ta (Ta1, Ta2, Ta3, Ta4) to which a plurality of driving circuits such as the source driver 21, the gate driver 22, the control circuit 30, the controller 50, and the like are connected, respectively, have a common layer structure. The heights of the terminal parts can be therefore made approximately uniform, as compared with a case where the layer structures of the terminal parts are different. Consequently, press-bonding these driving circuits to the respective terminal parts would not make connection defects occur between the terminal parts Ta and the driving circuits. Besides, since the first metal film 71, the second metal film 72, the first transparent electrode film 81, and the second transparent electrode film 82 are arranged so as to overlap with one another in the terminal parts Ta, reductions of resistances in terminal parts and space-saving for terminal parts Ta are achieved.

The foregoing description describes an exemplary display device according to the present invention, but the configuration of the display device according to the present invention is not limited to the configuration of the above-described embodiment; a variety of modified configurations can be applicable. The following description describes modification examples of the same.

Modification Example 1

The above-described embodiment is described with reference to an exemplary structure of the terminal part Ta in which the first metal film 71, the second metal film 72, the first transparent electrode film 81, and the second transparent electrode film 82 are sequentially laminated on one another, but the structure of the terminal part is not limited to this. The following description describes other exemplary configurations of the terminal part different from the configuration of the above-described embodiment.

Modification Example 1-1

Figure 9A:
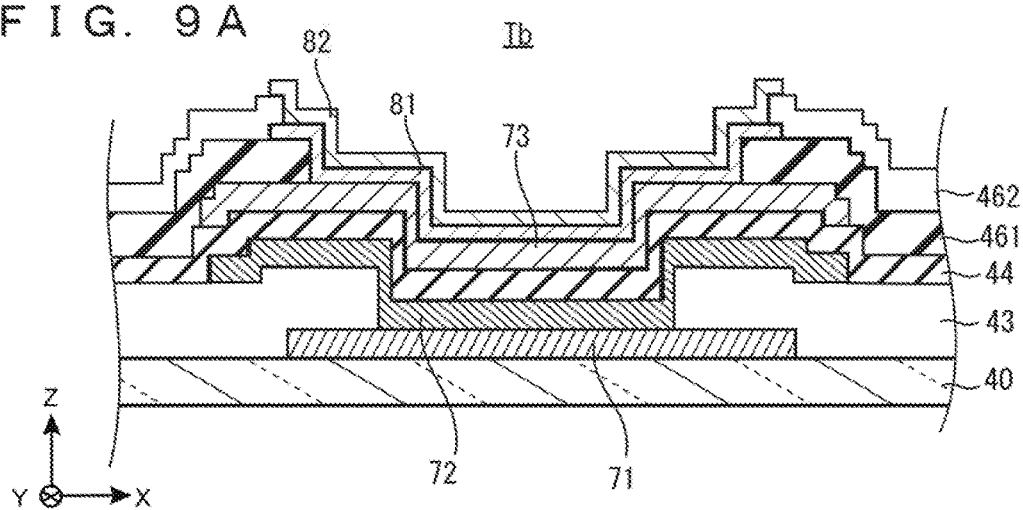
FIG. 9A is a cross-sectional view illustrating a terminal part in Modification Example 1-1.

FIG. 9A is a cross-sectional view illustrating an exemplary terminal part of the present modification example. In FIG. 9A, members identical to those in the embodiment are denoted by the same reference symbols as those in the embodiment. The following description principally describes parts that are different from those in the terminal part Ta of the embodiment.

As illustrated in FIG. 9A, in a terminal part Tb, an inorganic insulating film 44 is formed so as to cover a second metal film 72. On the inorganic insulating film 44, a third metal film 73 is formed so as to overlap with the second metal film 72 with the inorganic insulating film 44 being interposed therebetween. Further, a first insulating film 461 is formed so as to partially cover the inorganic insulating film 44 and the third metal film 73, and a first transparent electrode film 81 is formed partially on the first insulating film 461 so as to be in contact with the third metal film 73. Then, a second insulating film 462 is formed partially on the first insulating film 461 and the first transparent electrode film 81, and a second transparent electrode film 82 is formed partially on the second insulating film 462 so as to be in contact with the first transparent electrode film 81. In other words, the terminal part Tb has a structure in which the first metal film 71, the second metal film 72, the third metal film 73, the first transparent electrode film 81, and the second transparent electrode film 82 are sequentially laminated on one another, and is different from the terminal part Ta in the point of including the third metal film 73.

With this configuration, as is the case with the terminal part Ta, connection defects that would occur when a plurality of driving circuits such as the source driver 21, the gate driver 22, the control circuit 30, and the controller 50 are press-bonded with the terminal part Tb can be reduced, and moreover, resistances in the terminal part Tb can be reduced.

Figure 9B:
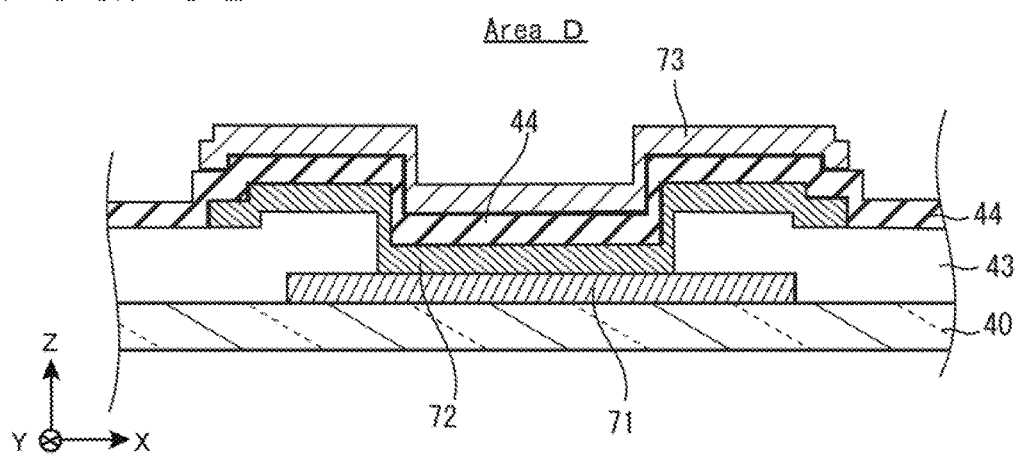
FIG. 9B is a cross-sectional view for explaining a method for producing the terminal part illustrated in FIG. 9A, illustrating a step of forming a third metal film on a first insulating film.

Incidentally, the terminal part Tb is formed through the following steps. The following description principally describes steps different from those of the embodiment. After the steps illustrated in FIGS. 8A to 8D of the above-described terminal part Ta, in the step illustrated in FIG. 8E, a third metal film is formed on the inorganic insulating film 44 in the area D. and photolithography, wet etching, and resist peeling are performed so as to pattern the third metal film. Through this step, the third metal film 73 is formed on the inorganic insulating film 44 in the area D (see FIG. 9B).

Figure 9C:
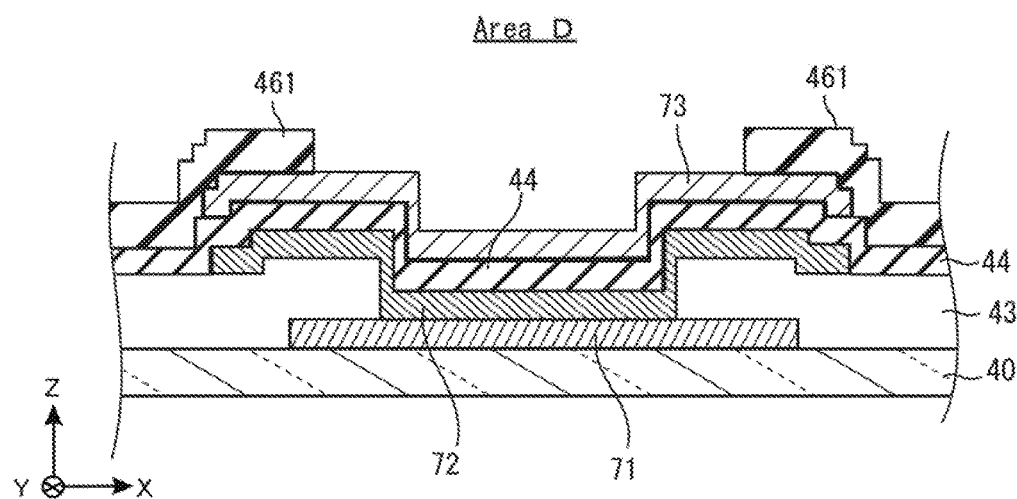
FIG. 9C is a cross-sectional view illustrating a step of forming a second insulating film on the third metal film illustrated in FIG. 9B.

Thereafter, in the step of FIG. 8F, a first insulating film is formed on the third metal film 73 in the area D, and photolithography, dry etching, and resist peeling are performed so as to pattern the first insulating film. Through this step, the first insulating film 461 is formed so that parts thereof are arranged so as to be positioned apart from each other on the third metal film 73 in the area D (see FIG. 9C).

Figure 9D:
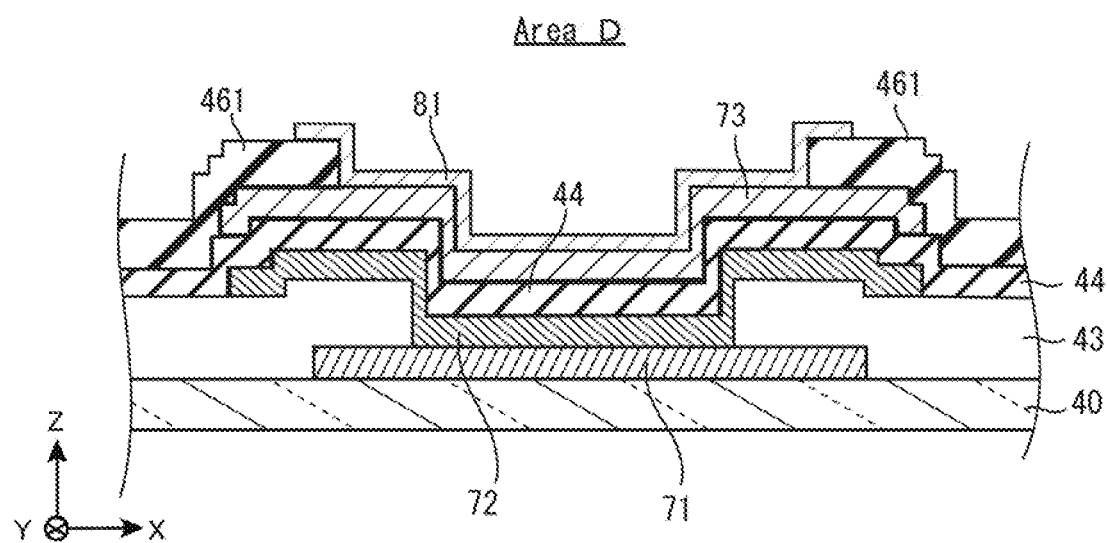
FIG. 9D is a cross-sectional view illustrating a step of forming a first transparent electrode film on the second insulating film and the third metal film illustrated in FIG. 9C.

Subsequently, after the step illustrated in FIG. 8G, in the step illustrated in FIG. 8H, a first transparent electrode film is formed on the first insulating film 461 in the area D, and photolithography, wet etching, and resist peeling are performed so as to pattern the first transparent electrode film. Through this step, in the area D, the first transparent electrode film 81 in contact with the third metal film 73 is formed (see FIG. 9D). Thereafter, by performing the above-described steps illustrated in FIGS. 8I and 8J, the terminal part Tb is formed (see FIG. 9A).

Modification Example 1-2

Figure 10:
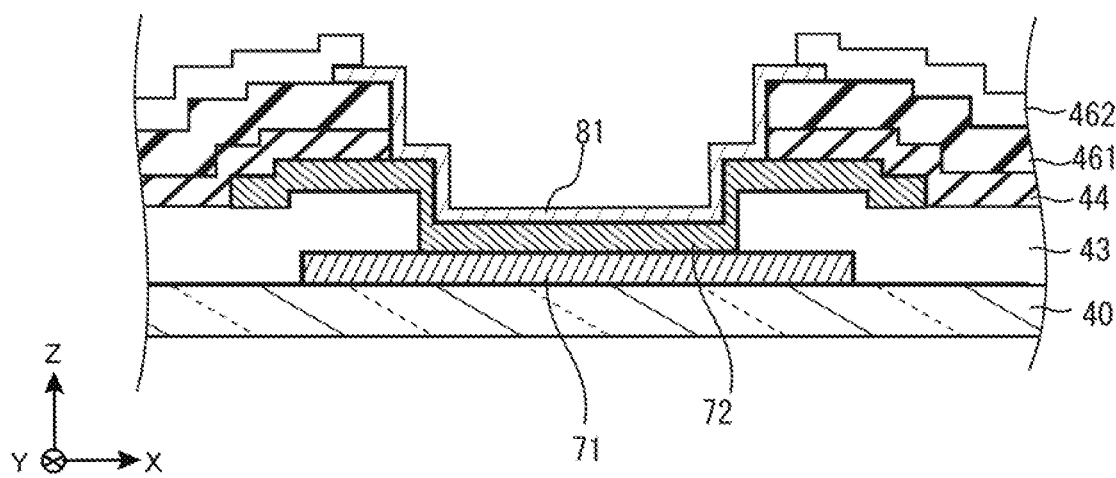
FIG. 10 is a cross-sectional view illustrating a terminal part in Modification Example 1-2.

FIG. 10 is a cross-sectional view illustrating another exemplary terminal part different from that illustrated in FIG. 9A. In FIG. 10, members identical to those in the embodiment are denoted by the same reference symbols as those in Embodiment 1. The following description principally describes parts that are different from those in the terminal part Ta of the embodiment.

As illustrated in FIG. 10, a terminal part Tc is different from the terminal part Ta in the point that, on the second insulating film 462, the second transparent electrode film 82 is not provided so as to be in contact with the first transparent electrode film 81. The terminal part Tc can be therefore formed through the above-described steps illustrated in FIGS. 8A to 8I.

In this case, as compared with the terminal part Ta, the resistances in the terminal part Tc cannot be decreased, but it is possible to allow the terminals for the connection with a plurality of driving circuits such as the source driver 21, the gate driver 22, the control circuit 30, and the controller 50 to have a common structure uniformly. As is the case with the terminal part Ta, therefore, connection defects that would occur when a plurality of driving circuits are press-bonded with the respective terminal parts Tc can be reduced.

Modification Example 1-3

Figure 11A:
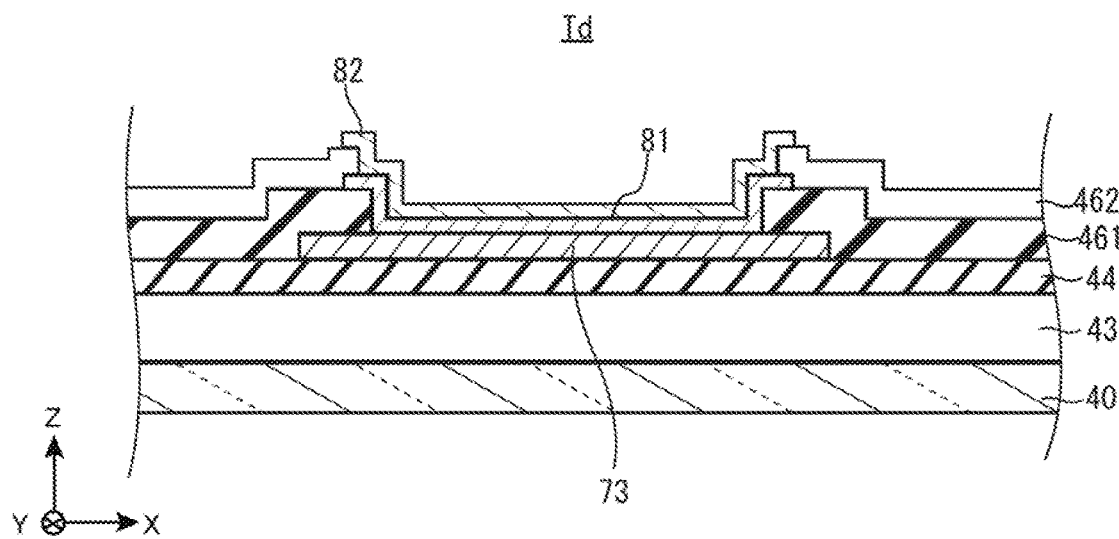
FIG. 11A is a cross-sectional view illustrating a terminal part in Modification Example 1-3.

FIG. 11A is a cross-sectional view illustrating another exemplary terminal part different from those illustrated in FIGS. 9A and 10. In FIG. 11A, members identical to those in Embodiment 1 are denoted by the same reference symbols as those in Embodiment 1. The following description principally describes parts that are different from those in the terminal part Ta of the Embodiment 1.

As illustrated in FIG. 11A, a terminal part Td is formed by laminating the gate insulating film 43 and the inorganic insulating film 44 on the glass substrate 40. Further, on the inorganic insulating film 44, the third metal film 73 is formed, and the first insulating film 461 is formed so as to overlap partially with the inorganic insulating film 44 and the third metal film 73. Then, the first transparent electrode film 81 is formed on the first insulating film 461 so as to be in contact with the third metal film 73, and the second insulating film 462 is formed so as to overlap partially with the first insulating film 461 and the first transparent electrode film 81. Further, the second transparent electrode film 82 is formed partially on the second insulating film 462 so as to be in contact with the first transparent electrode film 81. In this way, the terminal part Td is different from the terminal part Ta in the point that the third metal film 73 in contact with the first transparent electrode film 81 is provided, and the first metal film 71 and the second metal film 72 are not included.

In this case, the resistances in the terminal part Tc cannot be decreased as compared with the terminal part Ta, the respective terminals for the connection with the controller 50, the source driver 21, and the gate driver 22 can be allowed to have a common structure uniformly. As is the case with the terminal part Ta, therefore, connection defects that would occur when a plurality of driving circuits are press-bonded with the respective terminal parts Td can be reduced.

Figure 11B:
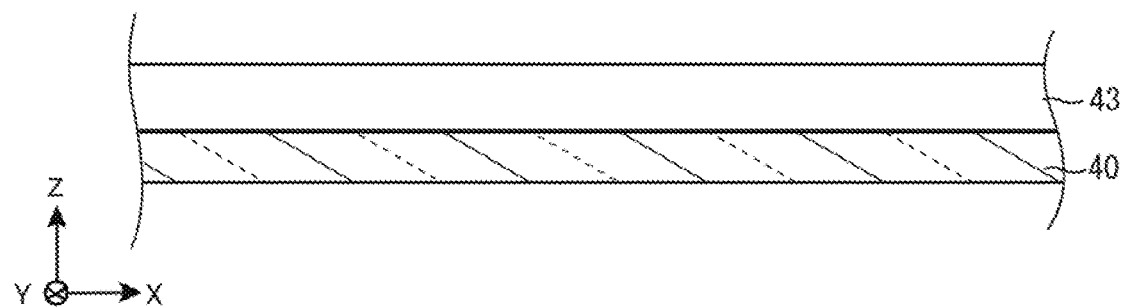
FIG. 11B is a cross-sectional view for explaining a method of producing a terminal part illustrated in FIG. 11A, illustrating a step of forming a gate insulating film on a substrate.
Figure 11C:
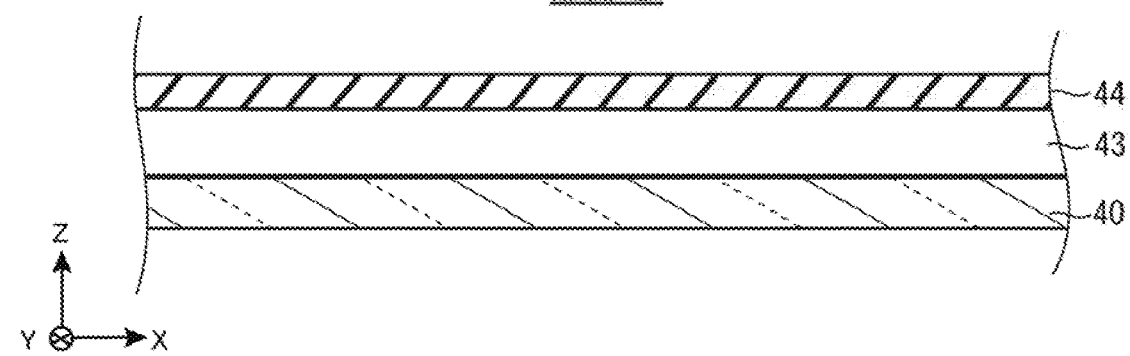
FIG. 11C is a cross-sectional view illustrating a step of forming an inorganic insulating film on the gate insulating film illustrated in FIG. 11B.

Incidentally, the terminal part Td is formed through the following steps. The following description principally describes steps different from those of the embodiment. In the above-described step illustrated in FIG. 8A, the first metal film is not formed in the area D, and in the step illustrated in FIG. 8B, the gate insulating film 43 is formed on the glass substrate 40 in the area D (see FIG. 11B). Subsequently, in the step illustrated in FIG. 8C, no opening 43a is formed in the gate insulating film 43 in the area D, and in the step illustrated in FIG. 8D, the inorganic insulating film 44 is formed on the gate insulating film 43 in the area D (see FIG. 11C).

Figure 11D:
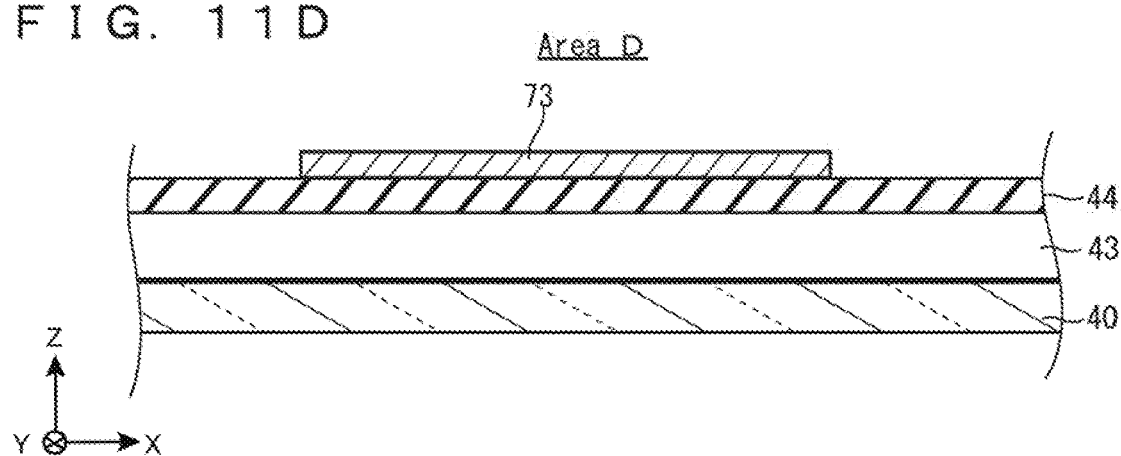
FIG. 11D is a cross-sectional view illustrating a step of forming a third metal film on the inorganic insulating film illustrated in FIG. 11C.

Next, in the step illustrated in FIG. 8E, the third metal film is formed on the inorganic insulating film 44 in the area D, and photolithography, wet etching, and resist peeling are performed so as to pattern the third metal film. Through this step, in the area D, the third metal film 73 is formed on the inorganic insulating film 44 (see FIG. 11D).

Figure 11E:
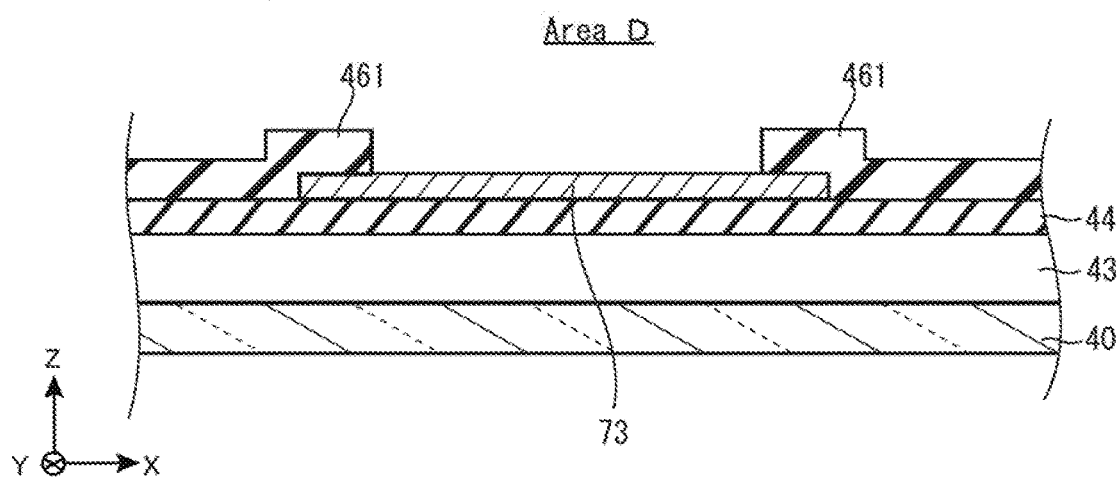
FIG. 11E is a cross-sectional view illustrating a step of forming a first insulating film on the third metal film illustrated in FIG. 11D.

Then, in the step illustrated in FIG. 8F, the first insulating film is formed on the third metal film 73, and photolithography, dry etching, and resist peeling are performed so as to pattern the first insulating film. Through this step, the first insulating film 461 is formed so that parts thereof are positioned apart from each other on the third metal film 73 in the area D (see FIG. 11E).

Figure 11F:
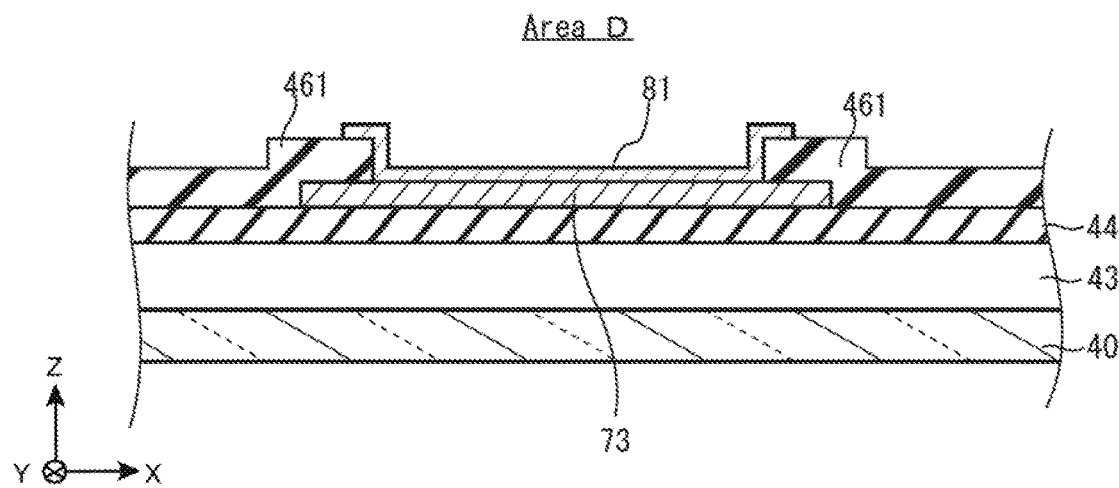
FIG. 11F is a cross-sectional view illustrating a step of forming a first transparent electrode film on the first insulating film and the third metal film illustrated in FIG. 11E.

Next, after the step Illustrated In FIG. 8G, in the step Illustrated in FIG. 8H, the first transparent electrode film is formed on the first insulating film 461, and photolithography, wet etching, and resist peeling are performed so as to pattern the first transparent electrode film. Through this step, in the area D, the first transparent electrode film 81 in contact with the third metal film 73 is formed (see FIG. 11F). By performing the above-described steps illustrated in FIGS. 8I and 8J thereafter, the terminal part Td is formed (see FIG. 11A).

Modification Example 2

In the above-described embodiment and modification examples, an etching stopper layer may be provided between the source electrode 42c and the drain electrode 42d of the TFT 42. This configuration makes it possible to prevent the semiconductor film 42b from being damaged by etching performed for forming the source electrode 42c or the drain electrode 42d.

Modification Example 3

Further, the above-described embodiment and modification examples are described with reference to the configuration in which an exemplary TFT of the bottom gate type is used, but the TFT may be of the top gate type. Still further, the semiconductor film 42b is not limited to an oxide semiconductor film, but may be an amorphous silicon film.

Modification Example 4

The above-described embodiment and modification examples are described with reference to an exemplary touch-panel-equipped display device that includes an active matrix substrate that has an image display function and a touch position detection function, but the active matrix substrate may be an active matrix substrate that has the image display function alone. In this case, it is unnecessary to form the signal line 52 for touch position detection, and the connection part Ca for connection of the terminal part Ta and the signal line 52 with each other.

The invention claimed is:

1. A display device including an active matrix substrate, wherein the active matrix substrate includes:
a gate line made of a first metal film;
a data line that is arranged so as to intersect with the gate line and made of a second metal film;
a display control element that includes a gate electrode connected to the gate line, a semiconductor film, a source electrode connected to the data line, and a drain electrode;
a pixel electrode that is connected to the drain electrode and made of a first transparent electrode film;
a counter electrode that makes a capacitor between the counter electrode and the pixel electrode and is made of a second transparent electrode film;
a display driving circuit that supplies a control signal to at least one of the gate line and the data line;
a signal line that is connected with the counter electrode, and to which a driving signal for touch detection is supplied, the signal line being made of a third metal film;
a touch detection driving circuit that supplies a driving signal for touch detection; and
a plurality of terminals including a first terminal that connects at least one of the gate line and the data line with the display driving circuit and a second terminal that connects the signal line with the touch detection driving circuit,
wherein the first metal film, the second metal film, and the first transparent electrode film are sequentially laminated at the first terminal and the second terminal, and
the first metal film and the second metal film are directly in contact with each other at the first terminal and the second terminal.

2. The display device according to claim 1,
wherein the second transparent electrode film is laminated on the first transparent electrode film at the first terminal and the second terminal.

3. The display device according to claim 1,
wherein the active matrix substrate further includes an insulating film between the pixel electrode and the data line, and
the first metal film, the second metal film, the insulating film, the third metal film, the first transparent electrode film, and the second transparent electrode film are sequentially laminated at the first terminal and the second terminal.

4. The display device according to claim 1,
wherein the active matrix substrate further includes a first insulating film and a second insulating film between the signal line and the counter electrode, and
the second insulating film is arranged above a part of the first transparent electrode film at the first terminal and the second terminal.

5. The display device according to claim 1,
wherein the active matrix substrate further includes an organic insulating film between the pixel electrode and the data line,
wherein the organic insulating film is not arranged at the first terminal and the second terminal.

6. The display device according to claim 1, further comprising:
a counter substrate that includes a color filter; and
a liquid crystal layer provided between the active matrix substrate and the counter substrate.

7. The display device according to claim 1, further comprising:
a gate insulating film between the gate line and the data line; and
an inorganic insulating film between the data line and the pixel electrode,
wherein the gate insulating film includes first openings at the first terminal and the second terminal
the inorganic insulating film includes second openings at the first terminal and the second terminal, and
the first openings and the second openings overlap with each other.

8. A display device including an active matrix substrate, wherein the active matrix substrate includes:
agate line made of a first metal film;
a data line that is arranged so as to intersect with the gate line and made of a second metal film;
a display control element that includes a gate electrode connected to the gate line, a semiconductor film, a source electrode connected to the data line, and a drain electrode;
a pixel electrode that is connected to the drain electrode and made of a first transparent electrode film;
a counter electrode that makes a capacitor between the counter electrode and the pixel electrode and is made of a second transparent electrode film;

a display driving circuit that supplies a control signal to at least one of the gate line and the data line;

a signal line that is connected with the counter electrode, and to which a driving signal for touch detection is supplied, the signal line being made of a third metal film;

a touch detection driving circuit that supplies a driving signal for touch detection; and a plurality of terminals including a first terminal that connects at least one of the gate line and the data line with the display driving circuit and a second terminal that connects the signal line with the touch detection driving circuit, wherein the third metal film, the first transparent electrode film, and the second transparent electrode film are sequentially laminated at the first terminal and the second terminal.

9. A producing method for producing an active matrix substrate that includes: a display control element that includes a gate electrode, a semiconductor film, a source electrode, and a drain electrode; and a terminal part for connecting a driving circuit, the method comprising the steps of:

in the active matrix substrate, forming the gate electrode with a first metal film in a display control element area where the display control element is formed, and forming the first metal film in a terminal part area where the terminal part is formed;

forming an insulating film so that the insulating film covers the gate electrode and the first metal film in the display control element area and the terminal part area, and forming a first opening in the insulating film on the first metal film;

forming a semiconductor film so that the semiconductor film overlaps with the gate electrode, with the insulating film being interposed therebetween, in the display control element area;

forming a second metal film so that the source electrode and the drain electrode with the second metal film are formed on the semiconductor film in the display control element area, and so that the second metal film is in contact with the first metal film in the first opening in the terminal part area;

forming an inorganic insulating film on the source electrode and the drain electrode in the display control element area, as well as on the second metal film in the terminal part area;

forming a first insulating film on the inorganic insulating film in the display control element area and the terminal part area;

forming second openings that pass through the inorganic insulating film and the first insulating film and overlap with the first opening, in the display control element area and the terminal part area;

forming a first transparent electrode film on the first insulating film, so that the first transparent electrode film is in contact with the drain electrode in the second opening in the display control element area, and is in contact with the second metal film in the second opening in the terminal part area;

forming a second insulating film on the first insulating film and the first transparent electrode film in the display control element area and the terminal part area, and forming a third opening that overlaps with the first opening and the second opening in the second insulating film in the terminal part area; and forming a second transparent electrode film on the second insulating film so that a counter electrode with the second transparent electrode film is formed on the second insulating film in the display control element area, and so that the second transparent electrode film is in contact with the first transparent electrode film in the third opening in the terminal part area.

10. The producing method according to claim 9, further comprising the step of:

after the step of forming the inorganic insulating film in the display control element area and the terminal part area, forming an organic insulating film on the inorganic insulating film, and removing the organic insulating film in the terminal part area.

* * * * *